(12) United States Patent
Yamazaki et al.

(10) Patent No.: US 7,306,978 B2
(45) Date of Patent: Dec. 11, 2007

(54) LIGHT EMITTING DEVICE AND METHOD OF MANUFACTURING THEREOF

(75) Inventors: Shunpei Yamazaki, Setagaya (JP); Masayuki Sakakura, Ebina (JP); Masaharu Nagai, Atsugi (JP); Yutaka Matsuda, Tochigi (JP); Keiko Saito, Atsugi (JP); Hisao Ikeda, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 201 days.

(21) Appl. No.: 10/941,837

(22) Filed: Sep. 16, 2004

(65) Prior Publication Data

US 2005/0062057 A1    Mar. 24, 2005

(30) Foreign Application Priority Data

Sep. 19, 2003  (JP) .............................. 2003-328942

(51) Int. Cl.
*H01L 21/00* (2006.01)

(52) U.S. Cl. .......................... 438/149; 438/22; 438/29; 438/150; 438/151; 438/154; 438/155; 438/158; 438/163; 438/164

(58) Field of Classification Search ................. 438/22, 438/29, 149–151, 154–155, 158, 163–164
See application file for complete search history.

(56) References Cited

U.S. PATENT DOCUMENTS

| | | | |
|---|---|---|---|
| 5,831,708 A | 11/1998 | Hiraishi et al. | |
| 6,599,785 B2 | 7/2003 | Hamada et al. | |
| 6,599,788 B1* | 7/2003 | Kawasaki et al. | 438/158 |
| 6,781,148 B2 | 8/2004 | Kubota et al. | |
| 2001/0026835 A1* | 10/2001 | Tanaka | 427/96 |
| 2001/0034088 A1* | 10/2001 | Nakamura et al. | 438/166 |
| 2002/0016028 A1* | 2/2002 | Arao et al. | 438/149 |
| 2002/0101152 A1 | 8/2002 | Kimura | |
| 2002/0119606 A1* | 8/2002 | Hamada et al. | 438/149 |
| 2002/0132383 A1* | 9/2002 | Hiroki et al. | 438/17 |
| 2002/0134981 A1 | 9/2002 | Nakamura et al. | |
| 2003/0064552 A1* | 4/2003 | Tanaka et al. | 438/163 |

(Continued)

FOREIGN PATENT DOCUMENTS

CN    1386391    12/2002

(Continued)

OTHER PUBLICATIONS

Office Action (Application No. 200410078765.3) dated Mar. 2, 2007.

*Primary Examiner*—M. Wilczewski
*Assistant Examiner*—Bac H. Au
(74) *Attorney, Agent, or Firm*—Eric J. Robinson; Robinson Intellectual Property Law Office, P.C.

(57) ABSTRACT

The present invention provides a highly stable light emitting device having high light-emitting efficiency (light-extraction efficiency) with high luminance and low power consumption, and a method of manufacturing thereof. A partition wall and a heat-resistant planarizing film are formed of a same material so as to be well-adhered to each other, thereby reducing material costs. Either an anode or a cathode is formed on the heat-resistant planarizing film. The partition wall and the heat-resistant planarizing film is adhered to each other without inserting a film having different refractive index therebetween, and therefore reflection of light is not caused in an interface.

34 Claims, 12 Drawing Sheets

U.S. PATENT DOCUMENTS

| | | |
|---|---|---|
| 2003/0071303 A1* | 4/2003 | Yamazaki et al. .......... 257/315 |
| 2003/0094615 A1 | 5/2003 | Yamazaki et al. |
| 2004/0007748 A1* | 1/2004 | Sakama et al. ............ 257/410 |
| 2004/0082195 A1* | 4/2004 | Yudasaka et al. ........... 438/782 |
| 2005/0045891 A1 | 3/2005 | Yamazaki et al. |
| 2005/0062409 A1 | 3/2005 | Yamazaki et al. |
| 2005/0067953 A1 | 3/2005 | Yamazaki et al. |

FOREIGN PATENT DOCUMENTS

| | | |
|---|---|---|
| JP | 2002-229482 | 8/2002 |
| JP | 2002-352950 | 12/2002 |

* cited by examiner terminal portion | pixel portion | peripheral portion terminal portion | pixel portion | peripheral portion

LIGHT EMITTING DEVICE AND METHOD OF MANUFACTURING THEREOF

BACKGROUND OF THE INVENTION

1. Field of the Invention

The present invention relates to a light emitting device having a circuit composed of a thin film transistor (hereinafter, referred to as a TFT), and a method of manufacturing thereof. For example, the invention relates to an electronic appliance mounted with a light emitting display device comprising an organic light-emitting element as a component.

2. Related Art

In recent years, research related to a light emitting device having an EL element as a self-luminous light emitting element has been actively carried out. The light emitting device has also been referred to as an organic EL display or an organic light-emitting diode. Since these light emitting devices have such characteristics as rapid response speed, low voltage, low power consumption driving, which are suitable for displaying moving pictures, they have been attracting much attention for next generation displays including new-generation cellular phones and personal digital assistants (PDAs).

An EL element using a layer including an organic compound as a light emitting layer has a structure in which the layer including an organic compound (hereinafter referred to as an EL layer) is sandwiched between an anode and a cathode. By applying an electric field to the anode and the cathode, electroluminescence is generated in the EL layer. Luminescence obtained from the EL element includes luminescence generated in returning to a ground state from an excited singlet state (fluorescence) and luminescence generated in returning to a ground state from an excited triplet state (phosphorescence).

However, sufficient luminance has not been obtained in the conventional light emitting element having the layer including an organic compound as a light emitting layer.

Light generated in the EL layer is emitted through the anode or the cathode to display images on a display surface. At this moment, the light generated in the EL layer is partially reflected by an interface between different material layers while passing through the various material layers, a substrate, and the like. As a result, there have been problems in which the amount of light transmitting though elements is reduced by several tens percent from initial light emission, and luminance is reduced.

Accordingly, the present inventors proposes an element structure for improving the light-extraction efficiency in patent documents 1 and 2.

Further, since the conventional light emitting element having the layer including an organic compound as a light emitting layer has low light-emitting efficiency, the amount of the current is increased in order to obtain the desired luminance, thereby increasing power consumption. Such high power consumption adversely affects the lifetime of an element. In particular, the half-life in luminance is shortened. Accordingly, there has been a problem in which the stability of the element must be improved.

[Patent document 1] Japanese Patent Laid-Open No. 2002-352950

[Patent document 2] Japanese Patent Laid-Open No. 2002-229482

SUMMARY OF THE INVENTION

In view of the foregoing, it is an object of the present invention to provide a highly stable light emitting device with high light-emitting efficiency (light-extraction efficiency), high luminance, and low power consumption, and a method of manufacturing the same.

In the invention, a transparent conductive film, which will serves as an anode, is formed on an insulating film such as heat-resistant planarizing film using a coating method. The transparent conductive film is used as a protection film for the heat-resistant planarizing film. For example, in case of forming a connection electrode for connecting to a TFT, the transparent conductive film is used as an etching stopper. When the connection electrode for connecting to the TFT is formed, the heat-resistant planarizing film is protected with the transparent conductive film. In the case of patterning the transparent conductive film, the heat-resistant planarizing film in a region not covered with a mask is slightly etched and a surface of the heat-resistant planarization film becomes uneven. However, a planarizing film is formed by the coating method in a step of forming a partition wall, and therefore the unevenness on the surface of the heat-resistant planarizing film is covered therewith.

Further, in case of patterning the partition wall, the surface of the transparent conductive film not covered with a mask is slightly etched. However, since the transparent conductive film is formed in contact with the heat-resistant planarizing film, the surface of the transparent conductive film remains smooth sufficiently even if only the surface thereof is etched.

The partition wall and the heat-resistant planarizing film are formed of a same material; and therefore the adhesiveness therebetween can be improved, and the material cost can be reduced. The partition wall and the heat-resistant planarizing film are directly in contact with each other without inserting a film having different refractive index therebetween, and therefore light is not reflected at an interface.

According to the invention, an anode is formed prior to forming a connection electrode for connecting to the TFTs, and hence, problems such as defect coverage of the anode caused by unevenness of the connection electrode do not arise.

In the invention, in order to fabricate a highly stable light emitting device, at least interlayer insulating films (including a planarizing film), the anode, and the partition wall for covering edges of the anode are formed of a material containing chemically and physically stable silicon oxide or a material containing silicon oxide as its main constituent.

Concretely, it is preferable that the interlayer insulating films and the partition wall be formed of a heat-resistant planarizing film obtained by the coating method. As a material for the interlayer insulating films and the partition wall, a coating film in which a skeleton structure is composed by bonding silicon (Si) and oxygen (O), and a substituent comprises at least one of hydrogen, fluorine, an alkyl group, and aromatic hydrocarbon is used. The coating film is then baked, thereby obtaining a SiOx film containing an alkyl group. The SiOx film containing an alkyl group has higher light transmitting properties than those of acrylic resin, and can withstand a heat treatment at a temperature of 300° C. or more.

According to the invention, a method for forming the interlayer insulating film and the partition wall by the coating method is as follows. At first, a substrate is washed with purified water. In order to improve wettability, the substrate is previously subjected to wet processing with thinner. A liquid raw material called varnish, in which a low-molecular weight component (precursor) including a silicon-oxygen bond is dissolved in a solvent, is applied on the entire surface of the substrate by spin coating and the like. Thereafter, the varnish coating the entire surface of the substrate is heated to volatilize (or evaporate) the solvent and to develop a cross-linking reaction of the low-molecular weight compound, thereby obtaining a thin coating film on the substrate. The coating film formed in the periphery of the substrate is partly removed. When the partition wall is formed, the resultant coating film may be patterned into a predetermined shape. The film thickness of the thin coating film is controlled by varying the spin number; rotation time; and concentration and viscosity of the varnish.

Since the interlayer insulating film and the partition wall are formed of the same material, devices such as a device for forming a coating film and an etching device are shared, thereby reducing manufacturing costs.

An EL element using a layer including an organic compound as a light emitting layer is generally formed of ITO (indium tin oxide) as an anode. However, the refractive index of ITO is as high as about 2. Therefore, in the present invention, the anode is composed of indium tin oxide including silicon oxide (SiOx)(hereinafter referred to as "ITSO"); indium tin oxide including silicon nitride (SiNx); or indium tin oxide including silicon oxynitride (SiOxNy). The ITSO remains in amorphous state without crystallization as well as ITO even if the ITSO is baked. As compared with the ITO, the ITSO has superior planarizing properties, and is difficulty shorted to a cathode even if the layer including an organic compound is thin in thickness. Accordingly, the ITSO is more suitable for the anode of the light emitting element than the ITO. Furthermore, indium tin oxide is added with silicon oxide having the refractive index of around 1.46 such that the refractive index of the ITSO, which will becomes the anode, is varied properly.

In addition, a light emitting element formed of the ITSO is superior in the efficiency (luminance/electric current), which is about 1.5 times as high as that of a light emitting element formed of the ITO.

According to one aspect of the invention, a method of manufacturing a light emitting device having a thin film transistor and a light emitting element on a substrate with an insulated surface, includes the steps of: forming a thin film transistor having a semiconductor layer including a source region, a drain region, and a channel formation region between the source and drain regions, a gate insulating film, and a gate electrode on a first substrate with the insulated surface; forming a heat-resistant planarizing film and a transparent conductive film on unevenness caused by the thin film transistor; selectively removing the heat-resistant planarizing film and the transparent conductive film so as to form an opening having a tapered side surface over the source region and the drain region and a peripheral portion having a tapered shape; selectively removing the gate insulating film so as to form a contact hole, which reaches to the source region or the drain region; forming a conductive film on the transparent conductive film; etching the conductive film using the transparent conductive film as an etching stopper to form an electrode, which reaches to the source region or the drain region; patterning the transparent conductive film in contact with the electrode to form an anode; forming a partition wall for covering edges of the anode; forming a layer including an organic compound on the anode; forming a cathode on the layer including an organic compound; adhering a second substrate to the first substrate with a sealant surrounding around the light emitting element so as to seal the light emitting element.

Further according to the invention, a method of manufacturing a display device comprising the steps of: forming a thin film transistor having a semiconductor layer including a source region, a drain region, and a channel formation region between the source region and the drain region, a gate insulating film, and a gate electrode over a substrate; forming an insulating film over the thin film transistor; forming a transparent conductive film over the insulating film; selectively removing the insulating film and the transparent conductive film so as to form an opening over the source region or the drain region; selectively removing the gate insulating film so as to form a contact hole reaching the source region or the drain region; forming a conductive film on the transparent conductive film; etching the conductive film using the transparent conductive film as an etching stopper so as to form an electrode reaching the source region or the drain region; and forming a pixel electrode by patterning the transparent conductive film in contact with the electrode.

In the above-mentioned structure, the heat-resistant planarizing film is a SiOx film containing an alkyl group formed by the coating method. The partition wall is a SiOx film containing an alkyl group formed by the coating method. Further, the anode is formed by sputtering using a target composed of indium tin oxide containing SiOx.

A structure manufactured in accordance with the above-mentioned method is also one feature of the invention. According to another aspect of the invention, a light emitting device includes a plurality of light emitting elements, each of the plurality of light emitting elements has a cathode, a layer including an organic compound, and an anode, wherein each of the plurality of light emitting elements is connected to a TFT, the anode connected to the TFT is formed on a heat-resistant planarizing film, a source electrode or a drain electrode of the TFF is formed on each edge of the anode composed of a transparent conductive film, and a partition wall is formed so as to cover a connection between the anode and the source electrode or the drain electrode.

In the above-described structure, the heat-resistant planarizing film and the partition wall are formed of the same material of a SiOx film containing an alkyl group.

Further, in the above-described structure, the light emitting device is applicable to either an active matrix light emitting device or a passive matrix light emitting device.

The light emitting element (EL element) has a layer including an organic compound which generates electroluminescence by being applied with an electric field (hereinafter referred to as an EL layer), an anode, and a cathode. Luminescence generated in the organic compound includes luminescence generated in returning to a ground state from an excited singlet state (fluorescence); and luminance generated in returning to a ground state from an excited triplet state (phosphorescence). The light emitting device manufactured according to the invention is applicable to each case of using fluorescence and phosphorescence.

The light emitting element (EL element) including an EL layer has a structure in which the EL layer is sandwiched between a pair of electrodes. The EL layer generally has a lamination structure. Typically, a lamination structure laminating a hole transporting layer, a light emitting layer, and an electrode transporting layer in this order is known. This lamination structure of the EL layer exhibit extremely high light-emitting efficiency. Therefore, the lamination structure is adopted in almost of all light emitting devices which has been researched and developed now.

Another structure including an anode, a hole injecting layer, a hole transporting layer, a light emitting layer, an electron transporting layer in this order; or a structure including an anode, a hole injecting layer, a hole transporting layer, a light emitting layer, an electron transporting layer, and an electron injecting layer in this order is also applicable. The light emitting layer may be doped with fluorescent pigment etc. Further, all of the layers may be composed of either a low-molecular weight material or a high-molecular weight material. Also, a layer including an inorganic compound may be employed. In the present specification, all layers formed between the cathode and anode are generically referred to as the EL layer. Accordingly, the EL layer includes all of the hole injecting layer, hole transporting layer, light emitting layer, electron transporting layer, and electron injecting layer.

In the light emitting device of the invention, the method of driving a screen display is not particularly limited. For example, a dot sequential driving method, a line sequential driving method, a surface sequential driving method, and the like may be used. A line sequential driving method is typically used, and a time division gray scale driving method or a surface area gray scale driving method may also be appropriately employed. Further, image signals input to a source line of the light emitting device may be either analog signals or digital signals. Driving circuits and the like may be appropriately designed according to the image signals.

In light emitting devices using digital video signals, there are one in which video signals are input to a pixel at a constant voltage (CV), and one in which video signals are input to a pixel at a constant current (CC). The light emitting devices in which video signals are input to a pixel at a constant voltage (CV) are further classified into one in which a constant voltage is applied to a light emitting element (CVCV), and another one in which a constant current is applied to a light emitting element (CVCC). Also, the light emitting device in which video signals are input to a pixel at a constant current (CC) is classified into one in which a constant voltage is applied to a light emitting element (CCCV), and another one in which a constant current is supplied to a light emitting element (CCCC).

In the light emitting device of the invention, a protection circuit (protection diode) may be provided for the purpose of preventing electrostatic discharge failures.

In the specification, the light-extraction efficiency indicates the ratio of amount of luminescence for an element emitted to the atmospheric air through a top surface of a transparent substrate to initial amount of luminescence for the element.

The invention can be applied to any TFT structure, for example, a top-gate TFT, a bottom-gate (inverted-stagger type) TFT, and a staggered TFT.

A TFT electrically connected to the light emitting element may be either a p-channel TFT or an n-channel TFT. When the light emitting element is electrically connected to the p-channel TFT, the p-channel TFT may be connected to an anode; a hole injecting layer, a hole transporting layer, a light emitting layer, and an electron transporting layer may be laminated in this order on the anode; and then a cathode may be formed thereon. Alternatively, when the light emitting element is electrically connected to the n-channel TFT, the n-channel TFT may be connected to a cathode; an electron transporting layer, a light emitting layer, a hole transporting layer, and a hole injecting layer may be laminated in this order on the cathode; and then an anode may be formed thereon.

As for an active layer of a TFT, an amorphous semiconductor film, a semiconductor film including a crystalline structure, a compound semiconductor film including an amorphous structure, and the like can be arbitrarily used. In addition, the active layer of the TFT may be formed of a semiamorphous semiconductor film (also referred to as a microcrystalline semiconductor film) having the intermediate structure between an amorphous structure and a crystalline structure (including a single crystalline structure, and a polycrystalline structure). The semiamorphous semiconductor film has a third condition that is stable in terms of free energy, and includes a crystalline region having short range order and lattice distortion. Further, at least a part of the semiamorphous semiconductor film includes a crystal grain of from 0.5 to 20.0 nm in size, and Raman spectrum is shifted to a lower wavenumbers than 520 cm$^{-1}$. The diffraction peak of (111) and (220), which is believed to be originated in a crystalline silicon lattice, is observed in the semiamorphous semiconductor film by X-ray diffraction. Further, the semiamorphous semiconductor film is added with hydrogen or halogen of at least 1 atom % as a neutralizing agent for dangling bonds. The semiamorphous semiconductor film is formed by glow discharge decomposition with silicide gas (by plasma CVD). As for the silicide gas, $Si_2H_6$, $SiH_2Cl_2$, $SiHCl_3$, $SiCl_4$, $SiF_4$, and the like can be used, besides $SiH_4$. The silicide gas may also be diluted with $H_2$ or mixture of $H_2$ and one or more rare gas elements selected from the group consisting of He, Ar, Kr, and Ne. The dilution ratio may be in the range of from 1:2 to 1:1,000. The pressure may be approximately in the range of from 0.1 Pa to 133 Pa. The power frequency is in the range of from 1 MHz to 120 MHz, preferably 13 MHz to 60 MHz. The substrate heating temperature may be set to 300° C. or less, preferably from 100° C. to 250° C. As for impurity elements contained in the film, each concentration of impurities of atmospheric constituents such as oxygen, nitrogen, and carbon is preferably set to $1\times10^{20}$ cm$^{-1}$ or less. In particular, the oxygen concentration is set to $5\times10^{19}$/cm$^3$ or less; more preferably, $1\times10^{19}$/cm$^3$ or less. The electric field effect mobility μ of the TFT using the semiamorphous semiconductor film as the active layer is in the range of from 1 cm$^2$/Vsec to 10 cm$^2$/Vsec.

The light emitting element of the invention can increase the light-emitting efficiency, reduce consumption power, and enlarge the half-life of luminance. In addition, the light emitting element can improve the stability of elements and reliability of a light emitting device.

DETAILED DESCRIPTION OF THE INVENTION

A preferred embodiment mode of the present invention will hereinafter be described.

Figure 1A:
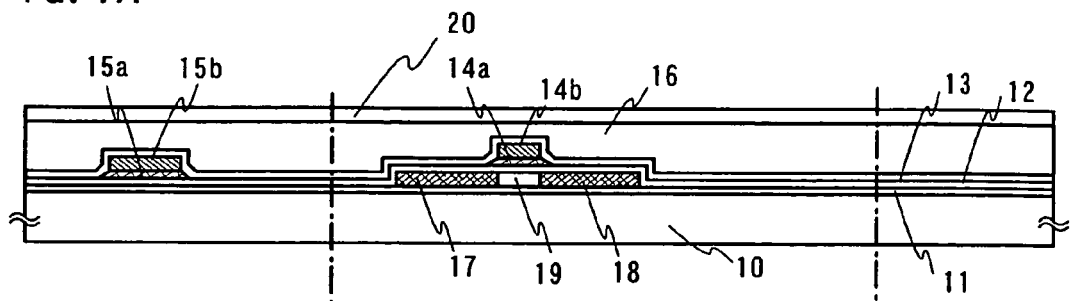
FIGS. 1A to 1E are cross sectional views showing steps according to the present invention.

In FIG. 1A, a base insulating film 11 is formed on a substrate 10. In the case where light is emitted through the substrate 10 to display images on a display surface, the substrate 10 may be formed of a glass substrate or a quartz substrate having light transmitting properties. Also, a heat-resistant plastic substrate having light transmitting properties, which can withstand a processing temperature, may be used. Alternatively, in the case where a surface opposite from the substrate 10 is used as a display surface to emit light therethrough, the substrate 10 may be formed of a silicon substrate, a metal substrate, or a stainless substrate having an insulated surface, besides the above-mentioned substrates. In the embodiment mode, the substrate 10 is composed of a glass substrate. The refractive index of the glass substrate is approximately 1.55.

As for the base insulating film 11, a base film composed of an insulating film such as a silicon oxide film, a silicon nitride film, and a silicon oxynitride film is formed. The embodiment mode shows an example of the base film having a two-layered structure. In addition, the base film may be formed of the insulating film having a single-layered structure or a two or more layered structure. Note that, the base insulating film may not particularly be provided.

Subsequently, a semiconductor layer is formed on the base insulating film. The semiconductor layer is formed as follows. A semiconductor film having an amorphous structure is formed by a known method (such as sputtering, LPCVD, and plasma CVD). The amorphous semiconductor is subjected to a known crystallization treatment (for example, laser crystallization, thermal crystallization, thermal crystallization using a catalyst such as nickel, and the like) to form a crystalline semiconductor film. The crystalline semiconductor film is patterned into a predetermined shape using a resist mask made from a first photomask, thereby forming the semiconductor layer. The thickness of the semiconductor layer is set to from 25 to 80 nm (preferably, from 30 to 70 nm). Although the material for the crystalline semiconductor film is not particularly limited, it is preferable that the crystalline semiconductor film be formed of silicon or silicon germanium (SiGe) alloy.

A continuous wave laser may be used for the crystallization treatment of the semiconductor film having the amorphous structure. In the crystallization of the amorphous semiconductor film, in order to obtain a crystal with large grain size, it is preferable to use a solid-state laser that is capable of continuous oscillation and use second to fourth harmonics of a fundamental wave. Typically, a second harmonic (532 nm) or a third harmonic (355 nm) of Nd:YVO$_4$ laser (fundamental wave: 1064 nm) is preferably employed. When the continuous wave laser is used, laser beam emitted from continuous wave YVO$_4$ laser that outputs 10 W is converted into a harmonic with a non-linear optical element. Alternatively, a YVO$_4$ crystal and a non-linear optical element may be put in a resonator to emit a harmonic. Then, the laser beam is formed into a rectangular shape or an elliptic shape at an irradiation surface with an optical system so as to irradiate the amorphous semiconductor film. At this moment, the energy density of approximately from 0.01 to 100 MW/cm$^2$ (preferably, from 0.1 to 10 MW/cm$^2$) is required. The laser beam may be irradiated to the amorphous semiconductor film while moving the amorphous semiconductor film relative to the laser beam at a rate of from about 10 to 2,000 cm/s.

After removing the resist mask, an insulating film 12 for covering the semiconductor layer is formed. The insulating film 12 is formed to have a film thickness of 1 to 200 nm by plasma CVD or sputtering. Preferably, the insulating film 12 is thinly formed with a thickness of 10 to 50 nm, and composed of an insulating film containing silicon, which has a single-layered or a lamination structure. The surface of the insulating film is nitrided using microwave plasma.

When the insulating film having thin film thickness is formed by plasma CVD, the rate of film formation is necessary to be reduced so as to control the thin film thickness of the insulating film, precisely. For example, the rate of forming a silicon oxide film can be set to 6 nm/min under the following conditions of the RF (10 kHz) electric power of 100 W; a pressure of 0.3 Torr; an N$_2$O gas flow rate of 400 sccm; and a SiH$_4$ gas flow rate of 1 sccm. The nitriding treatment using microwave plasma is carried out using a microwave power source (2.45 GHz) and nitrogen gas that is reaction gas.

The concentration of nitrogen is gradually reduced from a top surface of the insulating film 12 to a bottom surface thereof. Accordingly, the top surface of the insulating film 12 composed of the silicon oxide film can be nitrided in high concentrations. Furthermore, nitrogen at an interface between the silicon oxide film and an active layer is reduced, thereby preventing deterioration of the device characteristics. The insulating film 12 with a nitrided surface serves as a gate insulating film of a TFT.

Next, a conductive film is formed with a thickness of 100 to 600 nm on the insulating film 12. A conductive film composed by laminating a TaN film and a W film is formed by sputtering here. Although the conductive film is composed of a lamination of the TaN film and the W film, the structure of the conductive film is not particularly limited thereto. Alternatively, the conductive film may be formed of a single-layer or a lamination-layer of an element selected from Ta, W, Ti, Mo, Al, and Cu, or an alloy material or a compound material including the above-mentioned elements as its principal constituent. Furthermore, a semiconductor film typified by a polycrystalline silicon film doped with an impurity element such as phosphorous may also be used.

A resist mask is newly formed by using a second photomask to etch the conductive film by dry etching or wet etching. In the etching step, the conductive film is etched to form a conductive layers 14a, 14b, 15a and 15b. The conductive layers 14a and 14b serve as gate electrodes of the TFT, whereas the conductive layers 15a and 15b serve as terminal electrodes of the TFT.

After removing the resist mask, another resist mask is newly formed by using a third photomask. In order to form an n-channel TFT not illustrated in the drawings, a first doping step is carried out so as to dope an impurity element (typically, phosphorous or As) imparting n-type conductivity into the semiconductor layer in low concentrations. A region to be a p-channel TFT and the vicinity of the conductive layer are covered with the resist mask. In the first doping step, the semiconductor layer is doped through the insulating film to form a low concentration impurity region. In this embodiment mode, one light emitting element is driven by a plurality of TFTs. However, when one light emitting element is driven by only a p-channel TFT, the above-mentioned first doping step is not particularly necessary. Further, in the case of forming a pixel portion and a driver circuit on one substrate, the driver circuit may be formed of a COMS circuit including an n-channel TFT and a p-channel TFT.

After removing the resist mask, another resist mask is newly made from a fourth photomask to carry out a second doping step for doping an impurity element (typically, boron) imparting p-type conductivity into the semiconductor layer in high concentrations. In the second doping step, the semiconductor layer is doped though the insulating film 12 so as to form p-type high concentration impurity regions 17 and 18.

After removing the resist mask, another resist mask is newly formed by using a fifth photomask. In order to form an n-channel TFT not illustrated in the drawings, a third doping step is carried out to dope an impurity element (typically, phosphorous or As) imparting n-type conductivity into the semiconductor layer in high concentrations. The conditions of ion doping in the third doping step are as follows: the dosage is set to in the range of from $1 \times 10^{13}/cm^2$ to $5 \times 10^{15}/cm^2$; and an acceleration voltage is set to in the range of from 60 keV to 100 keV. The resist mask covers a region to be a p-channel TFT and the vicinity of the conductive layer. In the third doping step, the semiconductor layer is doped through the insulating film 12 so as to form an n-type high concentration impurity region.

Thereafter, the resist mask is removed. After forming an insulating film 13 containing hydrogen, the impurity elements added to the semiconductor layer are activated and hydrogenated. As for the insulating film 13 containing hydrogen, a silicon nitride oxide film (SiNO film) formed by plasma CVD is employed. Further, when the semiconductor layer is crystallized by using a metal element for promoting crystallization such as nickel, gettering can be performed to reduce the concentration of nickel contained in a channel formation region 19 at the time of the activation. The insulating film 13 containing hydrogen is a first layer of an interlayer insulating film, and further includes silicon oxide.

A heat-resistant planarizing film 16, which will be a second layer of the interlayer insulating film, is formed. The heat-resistant planarizing film 16 is formed of an insulating film having a skeleton structure composed by bonding silicon (Si) and oxygen (O), which is obtained by the coating method. Therefore, the second layer of the interlayer insulating film includes silicon oxide, as well as the first layer.

The procedure for forming the heat-resistant planarizing film 16 will be described in more detail below referring to FIGS. 5A to 5C.

The substrate to be processed is washed with purified water. Alternatively, mega-sonic washing may be performed. After baking the substrate for dehydrogenation at 140° C. for 110 seconds, the substrate is cooled for 120 seconds with a water-cooling plate to stabilize the temperature of the substrate. Then the substrate is transported into a spin-coating device as illustrated in FIG. 5A.

Figure 5A:
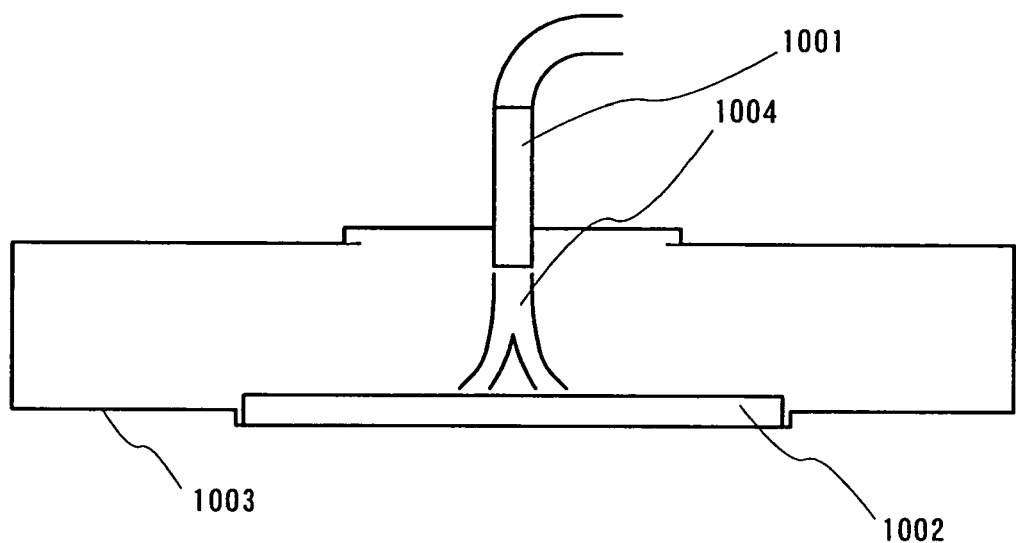
FIG. 5A is a diagram showing a coating device.
Figure 5B:
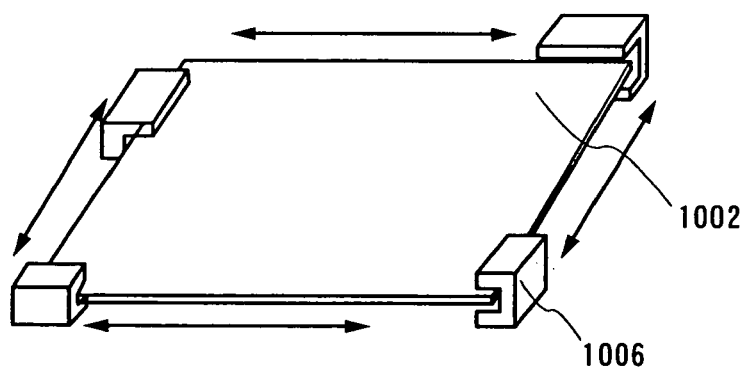
FIGS. 5B and 5C are diagrams showing an edge remover.
Figure 5C:
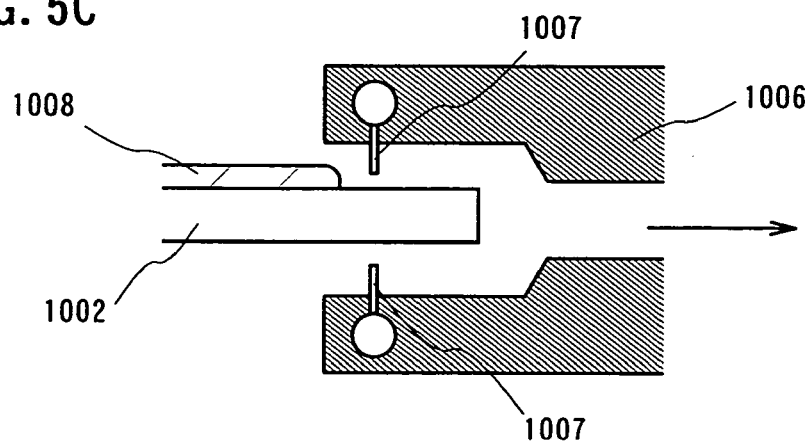

FIG. 5A is a cross sectional view of the spin-coating device. In FIG. 5A, reference numeral 1001 denotes a nozzle; 1002, a substrate; 1003, a coating cup; and 1004, a liquid coating material. The liquid coating material is jetted through the nozzle 1001. The substrate 1002 is horizontally accommodated in the coating cup 1003. The coating cup including the substrate is rotated. Further, a pressure can be controlled in the coating cup 1003.

In order to improve the wettability, the substrate is preliminarily coated with an organic solvent such as thinner (a volatile solvent mixed with aromatic hydrocarbon such as toluene, alcohols, acetic esters, and the like). The 70 ml thinner is dropped while spinning the substrate (rotation number: 100 rpm) to spread the thinner over the entire surface of the substrate by the centrifugal force. Subsequently, the substrate is spun at high speed (rotation number: 450 rpm) to remove the excess thinner.

Next, a liquid coating material using a liquid raw material in which siloxane polymer is dissolved in a solvent (propylene glycol monomethyl ether (molecular formula: $CH_3OCH_2CH(OH)CH_3$)) is dropped through the nozzle 1001 while spinning the substrate gradually (the rotation number is increased from 0 rpm to 1,000 rpm) so as to spread the liquid coating material on the entire surface of the substrate by the centrifugal force. The siloxane polymer can be classified into, for example, silica glass; alkylsiloxane polymer; alkylsilsesquioxane polymer; silsesquioxane hydride polymer; alkylsilsesquioxane hydride polymer; and the like in accordance with the structure of siloxane. As examples of the siloxane polymer, there are a coating material for an insulating film such as #PSB-K1 and #PSB-K31 manufactured by Toray Industries, Inc., and a coating material for an insulating film such as #ZRS-5PH manufactured by Catalysts & Chemicals Industries. Co., Ltd. The substrate is left for about 30 minutes. Then, the substrate is gradually spun again (the rotation number is increased from 0 rpm to 1,400 rpm) so as to level the surface of the coating film.

The interior of the coating cup 1003 is evacuated to reduce a pressure, and the coating film is then vacuum-dried within 1 minute.

Subsequently, the edge of the coating film is removed by using an edge remover provided in the spin-coating device as illustrated in FIG. 5A. FIG. 5B shows an edge remover 1006 having a driving means for moving the edge remover in parallel around the substrate 1002. The edge remover 1006 is equipped with thinner jet nozzles 1007 as depicted in FIG. 5C so as to sandwich a side of the substrate. The peripheral portion of the coating film 1008 is melted with the thinner jetted through the thinner jet nozzles 1007. A liquid and gas are discharged in a direction denoted by an arrow in the drawings to remove the melted coating film in the peripheral portion of the substrate.

The resultant substrate is then preliminarily baked at 110° C. for 170 seconds.

After the substrate is carried out of the spin-coating device and cooled, the substrate is further baked at 270° C. for 1 hour, thereby completing the heat-resistant planarizing film 16 with a thickness of 0.8 μm. When the smoothness of the heat-resistant planarizing film 16 thus obtained is measured with an AFM (atomic force microscope), the P-V value (peak-to valley, which is a difference in height between a maximum value and a minimum value) is about 5 nm, and the Ra (average surface roughness) value is about 0.3 nm.

Figure 7:
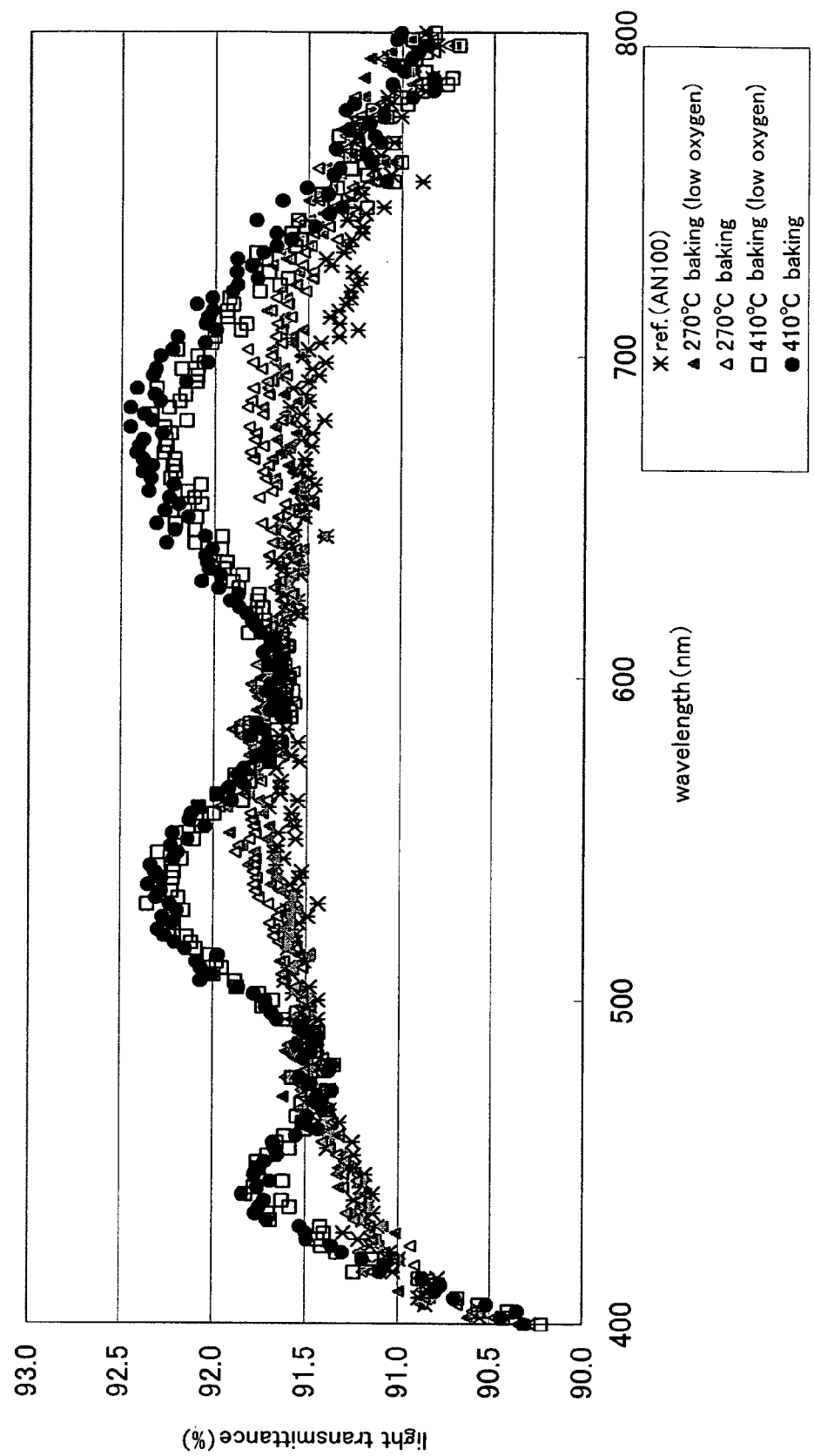
FIG. 7 is a graph showing light transmittances.
Figure 8:
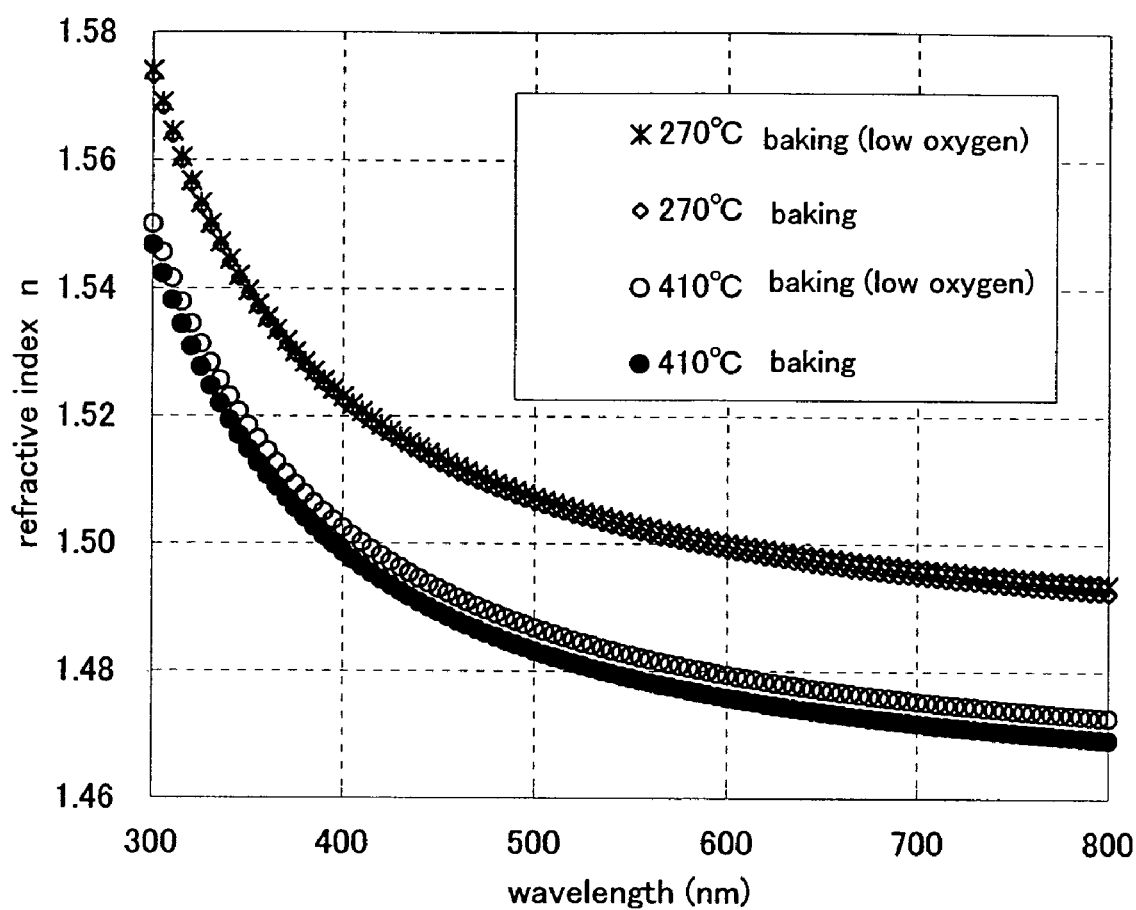
FIG. 8 is a graph showing refractive indices.

By varying the baking temperatures of the heat-resistant planarizing film 16, the light transmittance can be changed. FIG. 7 shows the light transmittances of the heat-resistant planarizing film (a SiOx film containing an alkyl group) with a thickness of 0.8 μm under the different baking temperatures (270° C., and 410° C.). FIG. 8 shows the refractive indices thereof under the same conditions. When the baking temperature is set to 410° C., the light transmittance of the heat-resistant planarizing film is increased as compared with the case of 270° C. Furthermore, when the baking temperature is set to 410° C., the refractive index is decreased.

Further, the heat-resistant planarizing film 16 may be formed by ink jetting. In case of ink jetting, the liquid material can be saved.

Subsequently, a transparent conductive film 20, which will be a first electrode, is formed over the entire surface of the substrate to a thickness of 110 nm (FIG. 1A). The transparent conductive film 20, which will be the first electrode, is formed of ITSO (indium tin oxide containing silicon oxide formed by sputtering using a target made of ITO containing silicon oxide of from 2% to 10% by weight). A transparent conductive film such as a light-transmitting conductive oxide film including silicon oxide in which 2 to 20% zinc oxide (ZnO) into indium oxide may also be used for the transparent conductive film 20, besides ITSO. In addition, a transparent conductive film composed of antimony tin oxide (ATO) including silicon oxide may also be used. The transparent conductive film 20 is formed on the entire surface of the heat-resistant planarizing film. When the entire surface of the transparent conductive film 20 is subjected to CMP processing, the entire surface thereof is further leveled.

Figure 1B:
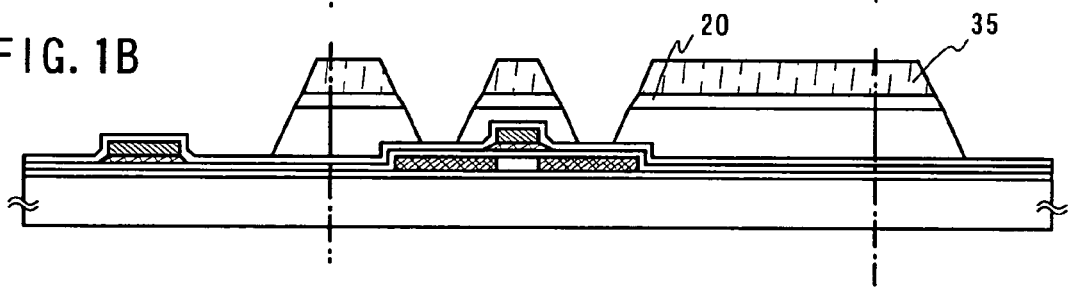

Contact holes are formed in the transparent conductive film 20 composed of the ITSO film and the heat-resistant planarizing film 16 with use of a sixth mask 35 at the same time as removing the heat-resistant planarizing film 16 in the peripheral portion (FIG. 1B). The transparent conductive film 20 and the heat-resistant planarizing film 16 are etched (wet etched or dry etched) under a condition of favorable selected ratio to the insulating film 13. Although etching gas used in the etching is not particularly limited, $CF_4$, $O_2$, He, and Ar are preferably used in this step. Here, the transparent conductive film 20 and the heat-resistant planarizing film 16 are dry etched under the conditions of the $CF_4$ flow rate of 380 sccm; the $O_2$ flow rate of 290 sccm; the He flow rate of 500 sccm; the Ar flow rate of 500 sccm; the RF power of 3,000 W; and a pressure of 25 Pa. In order to etch the transparent conductive film and the heat-resistant planarizing film without leaving residue on the insulating film 13, it is preferable that etching time be increased by 10 to 20%. The transparent conductive film and the heat-resistant planarizing film may be formed to have a tapered shape by one etching treatment or by a plurality of etching treatments. In the embodiment mode, the transparent conductive film and the heat-resistant planarizing film are subjected to the second dry etching under the conditions of the $CF_4$ flow rate of 550 sccm; the $O_2$ flow rate of 450 sccm; the He flow rate of 350 sccm; the RF power of 3,000 W, and a pressure of 25 Pa so as to have a tapered shape. The taper angle θ of the sides for the heat-resistant planarizing film is desirably set to more than 30° and less than 75°.

Subsequently, an etching treatment is further performed while using the sixth mask 35 to selectively remove the exposed insulating films 12 and 13. The insulating films 12 and 13 are etched by using $CHF_3$ and Ar as etching gases. In order to etch the insulating films without leaving residue on the semiconductor layer, it is preferable that etching time is increased by 10 to 20%.

Figure 1C:
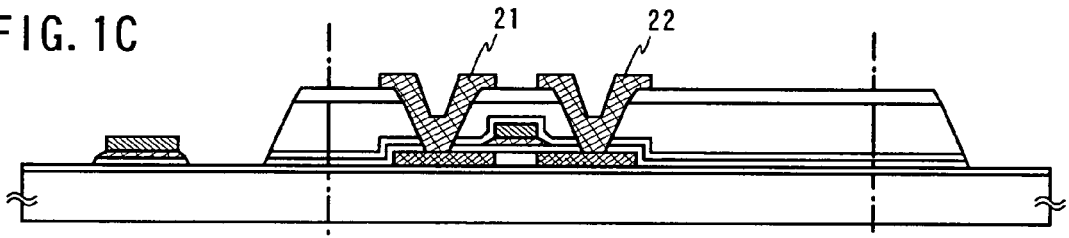
Figure 1D:
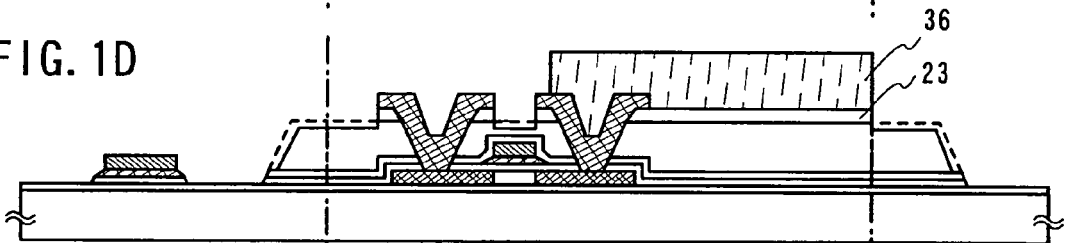

The sixth mask is then removed. After forming a conductive film (TiN/Al—Si/TiN), the conductive film is etched (dry etched using mixed a gas of $BCl_3$ and $Cl_2$) with use of a seventh mask so as to form wirings 21 and 22. A TFT is thus formed in this step (FIG. 1C). As compared with the etching rate of about 20 nm/min in the case of etching the transparent conductive (ITSO) film, the conductive film is etched under the conditions in which the etching rate of the TiN is about 160 nm/min; and the etching rate of the Al—Si is about 260 nm/min. Accordingly, the conductive film can serve as an etching stopper, sufficiently. In order to contact to the source region or the drain region of the TFT, it is preferable that the N content of the TiN be lower than 44%. Note that, the TiN film is one of materials, which is well adhered to the heat-resistant planarizing film 16.

It is preferable that the concentrations of In (indium) or Sn (tin) at the surface of the transparent conductive film (ITSO film) 20 be reduced by the above-described etching so as to increase the ratio of SiOx at the surface of the ITSO film.

The transparent conductive film 20 (110 nm in film thickness) is etched by using an eighth mask 36 to form a first electrode 23. The transparent conductive film formed in the region not overlapped with the eighth mask 36 and the wiring 21 is selectively removed in the etching treatment. At the same time, the surface of the heat-resistant planarizing film 16 in the region not overlapped with the eighth mask 36 and the wiring 21 is also etched with about 100 to 200 nm in thickness. The etched portions are filled with a partition wall formed of the same material as the heat-resistant planarizing film, which will be formed in a subsequent step.

Figure 1E:
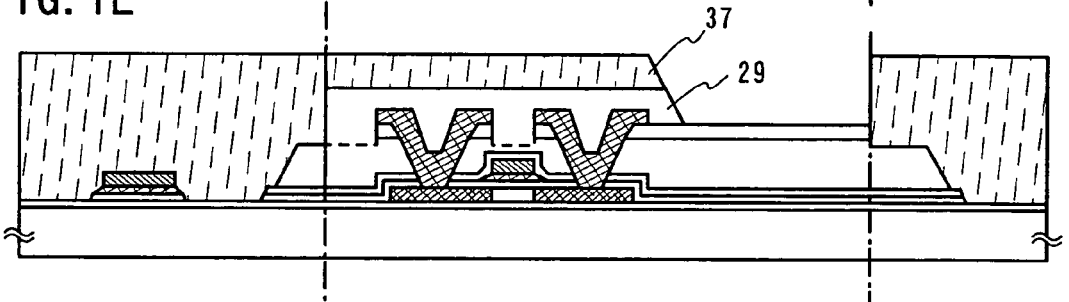

The eighth mask is removed. An insulator 29 (also referred to as a bank, a partition wall, a barrier, and the like) for covering an edge of the first electrode 23 and the TFT by using a ninth mask 37 (FIG. 1E).

As the insulator 29, a SOG film (such as a SiOx film containing an alkyl group) with a film thickness of from 0.8 to 1.0 μm is formed by the coating method. The insulator 29 may be either dry etched or wet etched. In the embodiment mode, the insulating film 29 is formed by dry etching using a mixed gas of $CHF_3$, $O_2$, and He. In the dry etching, the etching rate of the SiOx film containing an alkyl group is 500 to 600 nm/min, whereas the etching rate of the transparent conductive (ITSO) film is 10 nm/min or less. Accordingly, favorable etching ratio can be obtained.

Figure 3A:
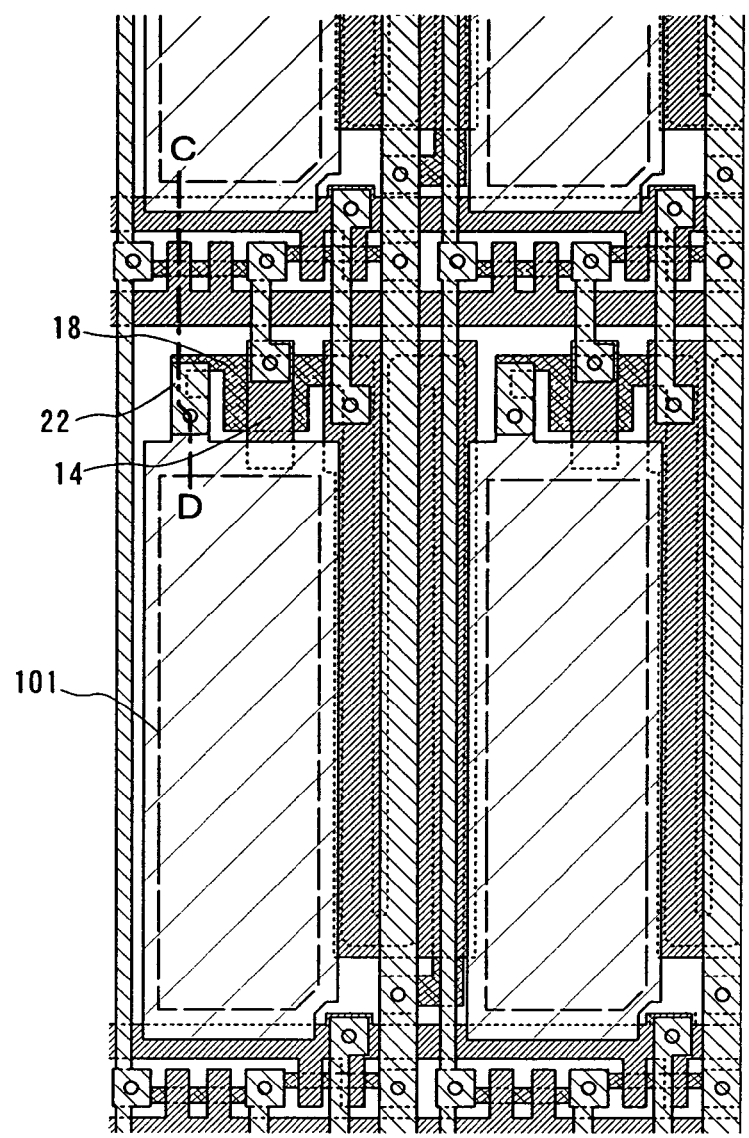
FIG. 3A is a top view of a pixel portion.
Figure 3B:
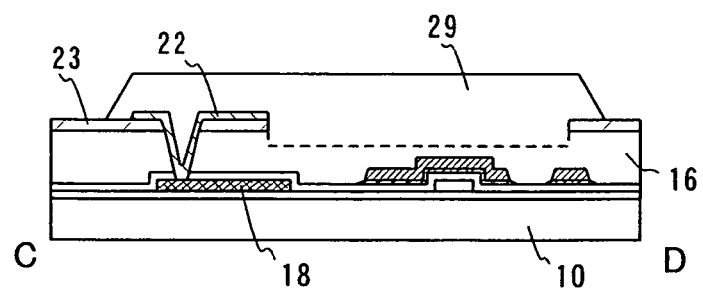
FIG. 3B is a cross sectional view of a pixel portion.

The ninth mask is then removed. A top view of a pixel portion formed up to the foregoing steps is illustrated in FIG. 3A, and a cross sectional view taken along a chained line C-D of FIG. 3A is illustrated in FIG. 3B. A region 101 surrounded by a dotted line, where is an edge of the partition wall, becomes a light-emitting region. In the cross section taken along the chained line C-D, the heat-resistant planarizing film 16 not covered with the transparent conductive film is etched to have a depression shape. The recessed area will be filled with the partition wall 29 formed in a subsequent step.

A layer 24 including an organic compound is next formed by vapor deposition or the coating method. In order to improve the reliability, a vacuum heating is preferably carried out to perform degassing prior to forming the layer 24 including the organic compound. In order to remove gases contained in the substrate, for example, it is favorable that a heat treatment be performed at a temperature of from 200° C. to 300° C. under a reduced pressure atmosphere or an inert atmosphere prior to carrying out vapor deposition of an organic compound material. Since the interlayer insulating film and the partition wall are formed of the highly heat-resistant SiOx film, a problem is not caused even if the heat treatment is performed at high temperature.

When the layer including the organic compound is formed by the coating method using spin coating, it is preferable that the film be coated and then baked by vacuum heating. For example, the entire surface of the substrate is applied with an aqueous solution of poly(ethylene dioxythiophene)/poly (styrene sulfonic acid) (PEDOT/PSS), which serves as a hole injecting layer, and then baked. Alternatively, the hole injecting layer may also be formed by vapor deposition. For instance, a MoOx film, which functions as a hole injecting layer, is vapor deposited. The voltage-luminance characteristic of the MoOx film is hardly varied even if the film thickness thereof is changed; and therefore, the MoOx film is optically designed, easily.

In the case where the layer 24 including the organic compound is formed by vapor deposition, the vapor deposition is carried out in a film formation chamber, which is vacuum evacuated up to the level of $5 \times 10^{-3}$ Torr (0.665 Pa) or less, more preferably, in the range of from $10^{-4}$ to $10^{-6}$ Torr. At the vapor deposition, the organic compound is vaporized by resistive heating in advance, and it is dispersed toward the substrate by opening a shutter. The vaporized organic compound is spattered upwardly and deposited over the substrate through an opening provided in a metal mask. In order to realize a full-color display, masks for each light-emitting color (R, G, and B) may be aligned, respectively.

Next, a second electrode 25, i.e. a cathode (or an anode) for an organic light emitting element is formed. The second electrode 25 may be formed by co-depositing aluminum and an element belonging to Group 1 or 2 of the periodic table or an alloy such as MgAg, MgIn, AlLi, $CaF_2$, and CaN. When the second electrode 25 is formed so as to have light transmitting properties, an aluminum film with a thickness of from 1 to 10 nm or an aluminum film containing trace amounts of Li may be formed and a transparent conductive film may be formed thereon.

Further, a layer having light transmitting properties (1 to 5 nm in thickness) composed of $CaF_2$, $MgF_2$, or $BaF_2$ may be formed as a cathode buffer layer prior to forming the second electrode 25.

A protection film 26 for protecting the second electrode 25 may also be provided. For instance, by using a disk target containing silicon, an atmosphere in the film formation chamber is set to be a nitrogen atmosphere or an atmosphere containing nitrogen and argon, such that the protection film composed of a silicon nitride film can be formed on the second electrode 25. A thin film (a DLC film, a CN film, or an amorphous carbon film) containing carbon as its main constituent may be formed as the protection film, and a film formation chamber for using CVD may additionally be provided. A diamond-like carbon film (also referred to as a DLC film) can be formed by plasma CVD (typically, RF plasma CVD, microwave CVD, electron cyclotron resonance (ECR) CVD, hot-filament CVD, or the like), a combustion flame method, sputtering, ion-beam evaporation, laser evaporation, and the like. Reaction gases used in the film formation are a hydrogen gas and a hydrocarbon group gas (for example, $CH_4$, $C_2H_2$, $C_6H_6$, and the like). The reaction gases are ionized by glow discharge, and resultant ions are accelerated and impacted to the cathode which is negatively self-biased to form a film. A CN film may be formed by using $C_2H_4$ gas and $N_2$ gas as the reaction gases. The DLC film and the CN film are insulating films which are transparent or translucent to visible light. The insulating film which transparent to visible light means that the film has 80 to 100% transmittance of visible light. Alternatively, the insulating film which translucent to visible light means that the film has 50 to 80% transmittance of visible light. Note that, the protection film is not necessary to be provided, if it is not necessary.

The substrate 10 is adhered to a sealing substrate 33 with a sealant 28 to seal a light emitting element. The sealant 28 is bonded so as to cover the edges (tapered portions) of the heat-resistant planarizing film 16. A region surrounded by the sealant 28 is filled with a transparent filler 27. A material for the filler 27 is not particularly limited if it has a light transmitting properties. Typically, either an ultraviolet ray curable epoxy resin or a thermosetting epoxy resin may be used. The embodiment mode employs a high heat-resistant UV ray curable epoxy resin (#2500 Clear, manufactured by Electrolite Cooperation) having the refractive index of 1.50; the viscosity of 500 cps; a Shore D hardness of 90; tensile strength of 3,000 psi; the Tg point of 150° C.; the volumetric resistivity of $1 \times 10^{15}$ Ω·cm; and a withstand voltage of 450 V/mil. The total light transmittance can be improved by filling the filler 27 between the pair of substrates.

Figure 2A:
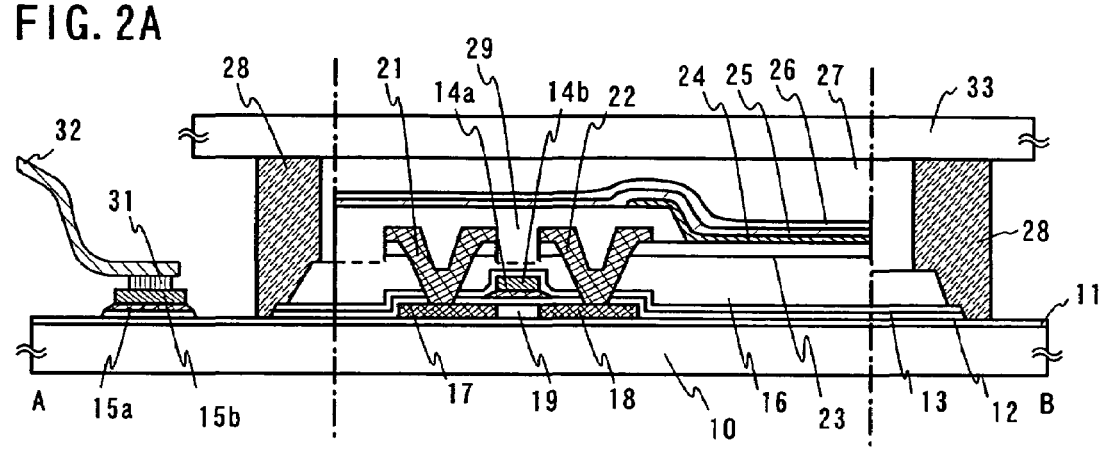
FIG. 2A is a cross sectional view of a light emitting device according to the invention.

Finally, an FPC (flexible printed circuit) 32 is attached to terminal electrodes 15a and 15b with an anisotropic conductive film 31 by a known method. The terminal electrodes 15a and 15b are formed at the same time as forming a gate wiring (FIG. 2A).

Figure 2B:
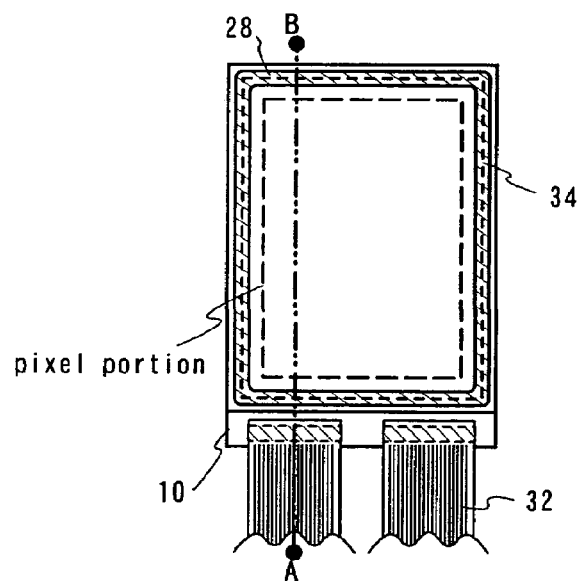
FIG. 2B is a top view thereof.

FIG. 2B shows a top view. As depicted in FIG. 2B, the edge 34 of the heat-resistant planarizing film is covered with the sealant 28. A cross section taken along a chained line A-B of FIG. 2B corresponds to a cross sectional view in FIG. 2A.

In the active matrix light emitting device manufactured above, as for the interlayer insulating films of the TFT, the heat-resistant planarizing film 16 and the partition wall are formed of the material in which a skeleton structure is composed by bonding silicon (Si) and oxygen (O); and the first electrode also includes silicon oxide. Accordingly, relatively stable materials containing silicon oxide are employed for the constituent materials of the active matrix light emitting device, thereby improving the reliability of the light emitting device.

Further, since the heat-resistant planarizing film 16 and the partition wall 29 are formed of the same starting material by the coating method, the adhesiveness therebetween is favorable, and hence, an interface is not formed in a region where the heat-resistant planarizing film and the partition wall are contacted to each other.

When the first electrode is formed of a transparent material and the second electrode is formed of a metal material, it is possible to have a structure in which light is emitted through the substrate 10, i.e., a bottom emission structure. Alternatively, when the first electrode is formed of a metal material and the second electrode is formed of a transparent material, it is possible to have a structure in which light is emitted through the sealing substrate 33, i.e., a top emission structure. Furthermore, when the first and second electrodes are formed of a transparent material, it is possible to obtain a structure in which light is emitted through both the substrate 10 and the sealing substrate 33. The present invention may have any one of the above-mentioned structures.

When light is emitted through the substrate 10, silicon oxide (the refractive index of about 1.46) is contained in each layer through which light generated in a light emitting layer passes, i.e., the first electrode; the first interlayer insulating film 13; the second interlayer insulating film 16; the gate insulating film 12; and the base insulating film 11. Therefore, the difference in the refractive indices between respective films is lessened, which increases the light-extraction efficiency. Namely, generation of stray light can be suppressed between the material layers having different refractive indices.

Preferred embodiments of the present invention will hereinafter be described in more detail.

[Embodiment 1]

Figure 4A:
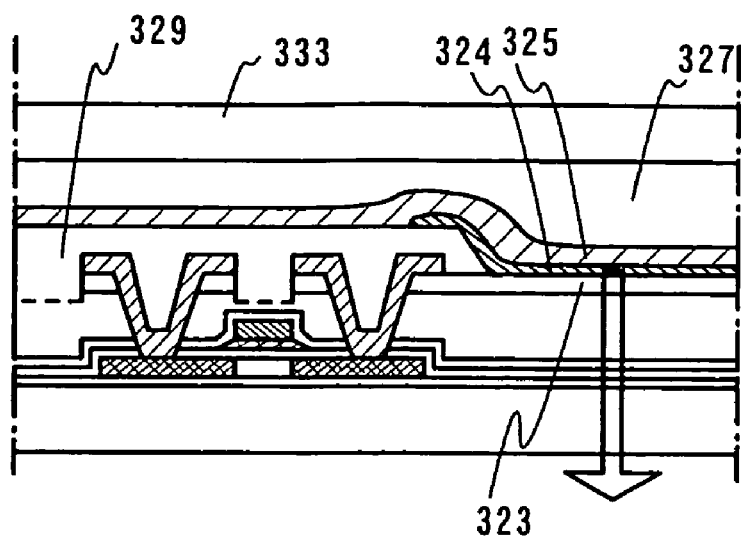
FIGS. 4A and 4B are cross sectional views of a light emitting device (Embodiment 1, and Embodiment 2)

The present embodiment will describe an example of a bottom-emission light emitting device with reference to FIG. 4A.

A TFT connected to a light emitting element is formed on a transparent substrate (which is a glass substrate having the refractive index of about 1.55). Since the device is a bottom-emission type, interlayer insulating films, a gate insulating film, and a base insulating film are formed of materials having high light transmitting properties, respectively. As a first interlayer insulating film, a SiNO film formed by PCVD is used. As the second interlayer insulating film, a SiOx film formed by the coating method is employed.

A transparent conductive film is formed on an entire surface of the second interlayer insulating film. The transparent conductive film will serve as a first electrode 323. The transparent conductive film is formed of ITSO (100 nm in thickness), which is a transparent conductive film including SiOx. The ITSO film is formed by sputtering using a target in which silicon oxide ($SiO_2$) of 1 to 10% is mixed into an indium tin oxide under the conditions of an Ar gas flow rate of 120 sccm; an $O_2$ gas flow rate of 5 sccm; a pressure of 0.25 Pa; and electric power of 3.2 kW. After forming the ITSO film, a heat treatment is carried out at 200° C. for 1 hour.

The substrate is etched using a mask, and the transparent conductive film and interlayer insulating films are selectively removed so as to form contact holes, which reach to an active layer of a TFT.

A laminated metal film including aluminum is formed and patterned to form a source electrode or a drain electrode, which is connected to the active layer. In the patterning, the transparent conductive film serves as an etching stopper so as to protect the second interlayer insulating film.

The transparent conductive film is then patterned to form a first electrode 323, which is electrically connected to the TFT. By etching the transparent conductive film in the patterning, the second interlayer insulating film is partly removed.

The SiOx film formed by the coating method is patterned to form a partition wall 329. The partition wall 329 is formed of the same material as the second interlayer insulating film. The depression portion where is partly removed from the second interlayer insulating film in the formation of the first electrode 323 is filled with the material for the partition wall.

A layer 324 including an organic compound is formed by vapor deposition or the coating method. In the embodiment, a light emitting element for emit green light is formed. MoOx (20 nm) and α-NPD (40 nm) are sequentially laminated by vapor deposition. Further, $Alq_3$ (37.5 nm) doped with DMQd by co-deposition, $Alq_3$ (37.5), and BzOs (benzoxazole derivative) (20 nm) doped with Li by co-deposition are sequentially laminated by vapor deposition.

As a second electrode 325, a film formed by co-depositing aluminum and an element belonging to Group 1 or 2 of the periodic table or an alloy such as MgAg, MgIn, AlLi, $CaF_2$, and CaN may be laminated over the substrate. In the embodiment, Al is vapor deposited with a thickness of 200 nm to form the second electrode 325. Note that, a protection film may be laminated thereon, if necessary.

A sealing substrate 333 is adhered to the resultant transparent substrate with a sealant (not illustrated in the drawing). A space 327 between the sealing substrate and the second electrode is filled with a filler, which is composed of an inert gas or a transparent resin.

The bottom-emission light emitting device is thus completed according to the foregoing steps. In the embodiment, the refractive indices or the film thicknesses for each layer (the interlayer insulating films, base insulating film, gate insulating film, and first electrode) are determined within the adjustable range such that reflection of light caused in each interface between the layers is suppressed. Consequently, the light-extraction efficiency can be improved.

[Embodiment 2]

Figure 4B:
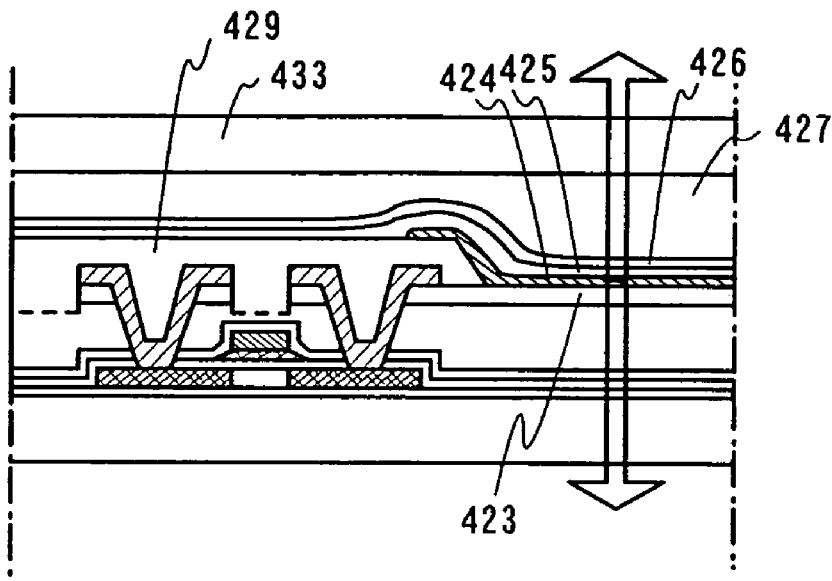

The present embodiment will describe an example of a light emitting device in which light can be emitted through both substrates with reference to FIG. 4B.

A TFT connecting to a light emitting element is formed on a transparent substrate (which is a glass substrate having the refractive index of about 1.55). In order to transmit light to display images, interlayer insulating films, a gate insulating film, and a base insulating film are formed of materials having high light transmitting properties, respectively. As for a first and third interlayer insulating films, a SiNO film formed by PCVD is used. As for a second interlayer insulating film, a SiOx film formed by the coating method is used.

A transparent conductive film is formed over an entire surface of the transparent substrate. The transparent conductive film will serves as a first electrode 423. The transparent conductive film is formed of ITSO (100 nm in thickness), which is a transparent conductive film including SiOx.

Subsequently, the substrate is etched with use of a mask so as to selectively remove the transparent conductive film and the interlayer insulating films, thereby is forming contact holes, which reach to an active layer of the TFT.

A laminated metal film containing aluminum is formed and patterned to form a source electrode or a drain electrode, which is connected to the active layer. In the patterning, the transparent conductive film serves as an etching stopper so as to protect the second interlayer insulating film.

The transparent conductive film is then patterned to form a first electrode 423, which is electrically connected to the TFT. In the patterning for etching the transparent conductive film, the second interlayer insulating film is also partly removed.

The SiOx film formed by the coating method is patterned to form a partition wall 429. The partition wall 429 is formed of the same material as the second interlayer insulating film. At the time of forming the first electrode 423, the portion, in which the second interlayer insulating film is partly removed, is filled with the material for the partition wall.

Next, a layer 424 including an organic compound is formed by vapor deposition or the coating method.

A second electrode 425 may be formed of either an alloy such as MgAg, MgIn, AlLi, $CaF_2$, and CaN, a thin film (1 to 10 nm in thickness) formed by co-depositing aluminum and an element belonging to Group 1 or 2 of the periodic table, or a transparent conductive film. In the embodiment, the second electrode 425 is formed of ITSO with a thickness of 110 nm by vapor deposition. Note that a protection film 426 may additionally be laminated, if necessary.

The resultant transparent substrate is adhered to a transparent sealing substrate 433 with a sealant (not illustrated in the drawing). A space 427 between the transparent sealing substrate and the second electrode is filled with a filler composed of an inert gas or a transparent resin.

Accordingly, it is possible to complete a light emitting device which can emit light through the transparent substrate with elements formed thereon and through the transparent sealing substrate 433.

[Embodiment 3]

Figure 6A:
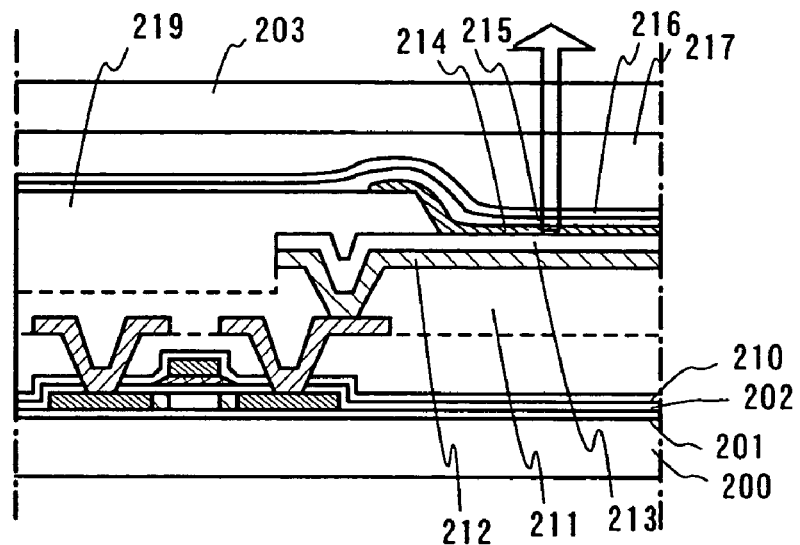
FIGS. 6A and 6B are cross sectional views of a light emitting device (Embodiment 3)
Figure 6B:
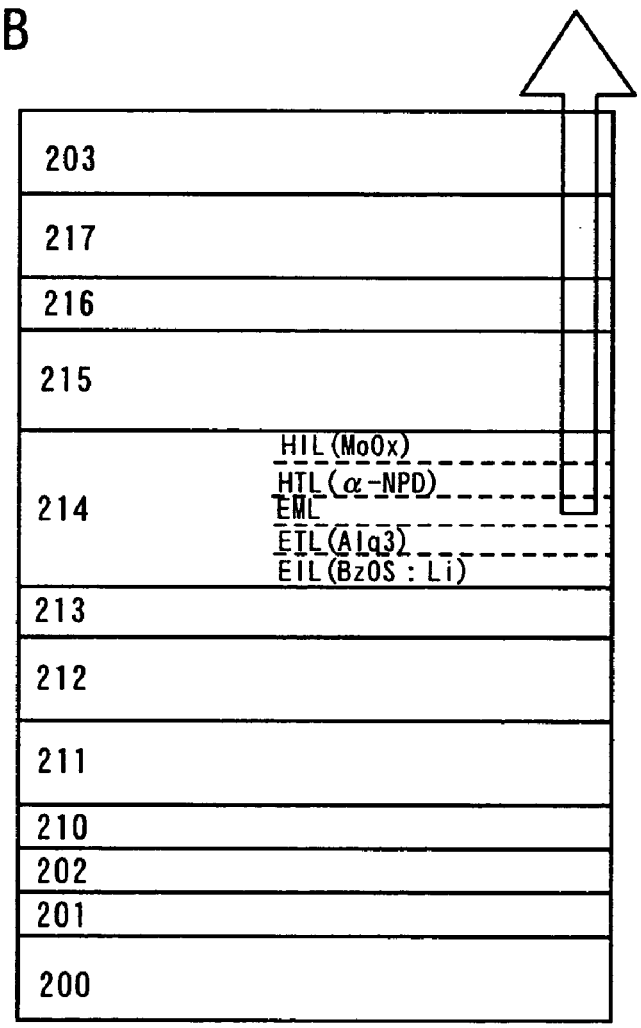

In Embodiment 3, an example of a top-emission light emitting device will be described with reference to FIGS. 6A and 6B.

An n-channel TFT connecting to a light emitting element is formed over a substrate 200 having an insulated surface. Since the top-emission light emitting device is formed in the present embodiment, interlayer insulating films, a gate insulating film 202, and a base insulating film 201 are not necessary to be formed of materials having the light emitting properties, respectively. In the embodiment, a first interlayer insulating film 210 is a SiNO film formed by PCVD, which is a highly stable material film. A second interlayer insulating film is a SiOx film formed by the coating method, which is a highly stable material film. The interlayer insulating films and the gate insulating film 202 are selectively etched to form contact holes, which reach to an active layer of the n-channel TFT. A conductive film (TiN/Al—Si/TiN) is then formed. The conductive film is etched (dry etched using a mixed gas of $BCl_3$ and $Cl_2$) with use of a mask so as to form a source electrode and a drain electrode of the n-channel TFT.

A third interlayer insulating film 211 is next formed of a SiOx film by the coating method. The third interlayer insulating film 211 is selectively etched to form contact holes, which reach to the source electrode and the drain electrode of the n-channel TFT.

A metal film having a light reflecting property (such as Al, and a lamination of Al and TiN) and a transparent conductive film are sequentially laminated over the substrate 200. The metal film and the transparent conductive film are patterned to form a reflective electrode 212 and a first electrode 213, which are electrically connected to the drain electrode (or the source electrode) of the n-channel TFT. The fist electrode 213 connecting to the n-channel TFT functions as a cathode of the light emitting element. In the patterning, the third interlayer insulating film 211 is partly removed and a depression is formed.

A partition wall 219 for covering a peripheral edge of the first electrode 213 is next formed. As for the partition wall 219, a SOG film (for example, a SiOx film containing an alkyl group) obtained by the coating method is used. The partition wall 219 is dry etched to have a predetermined shape. The region where the second interlayer insulating film is partly removed in the formation of the first electrode 213 is filled with the material of the partition wall.

A layer 214 including an organic compound is formed by vapor deposition or the coating method. FIG. 6B shows an example of a lamination structure for the layer 214 including an organic compound.

In the embodiment, a light emitting element, which emits green light, is formed. The layer 214 including an organic compound is composed by sequentially laminating BzOs (benzoxazole derivative) doped with Li by co-deposition (20 nm); $Alq_3$ (40 nm); $Alq_3$ doped with DMQd by co-deposition (40 nm); α-NPD (40 nm); MoOx (20 nm) by vapor deposition. By laminating these materials in this order, it is possible to prevent the layer 214 including an organic compound from being damaged by a sputtering step, which will be performed in a subsequent step. The voltage-luminance characteristic of the MoOx film is hardly varied even if the film thickness thereof is changed, and therefore, the MoOx film is optically designed, easily.

In order to realize a full-color display, light emitting layers (EMLs) for red, blue, and green may be selectively formed while using evaporation masks, properly.

Subsequently, a second electrode 215, i.e. an anode, is formed of a transparent conductive film. In this embodiment, the second electrode 215 is formed of an ITSO film with a thickness of 110 nm by sputtering. Note that, a protection film 216 may be formed, if necessary. The protection film 216 is formed of a single-layer or a lamination-layer of a silicon nitride film, a silicon oxide film, or a silicon oxynitride film.

The resultant substrate is adhered to a sealing substrate 203 with a sealant (not illustrated in the drawing). A space 217 between the sealing substrate and the second electrode is filled with a filler, which is composed of an inert gas or a transparent resin.

The top-emission light emitting device can thus be completed according to the foregoing steps.

[Embodiment 4]

Figure 9A:
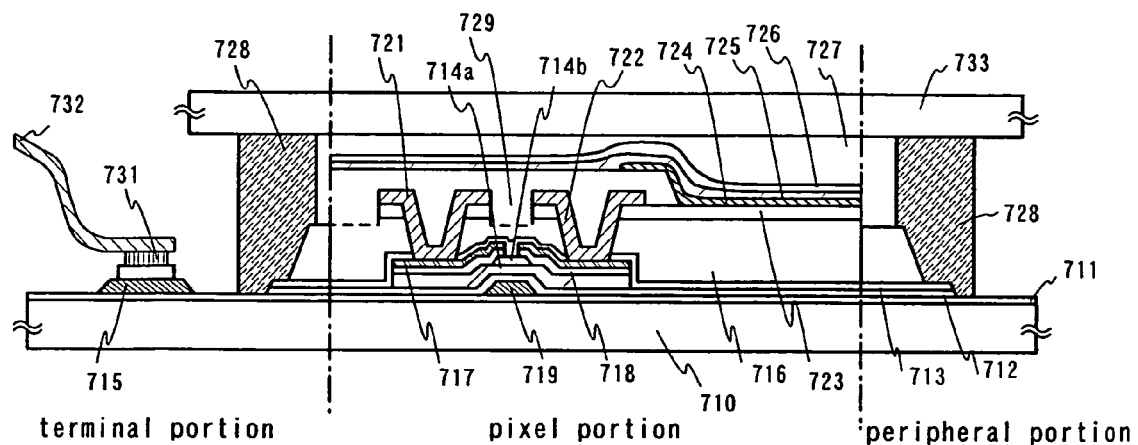
FIGS. 9A and 9B are cross sectional views of a light emitting device (Embodiment 4)
Figure 9B:
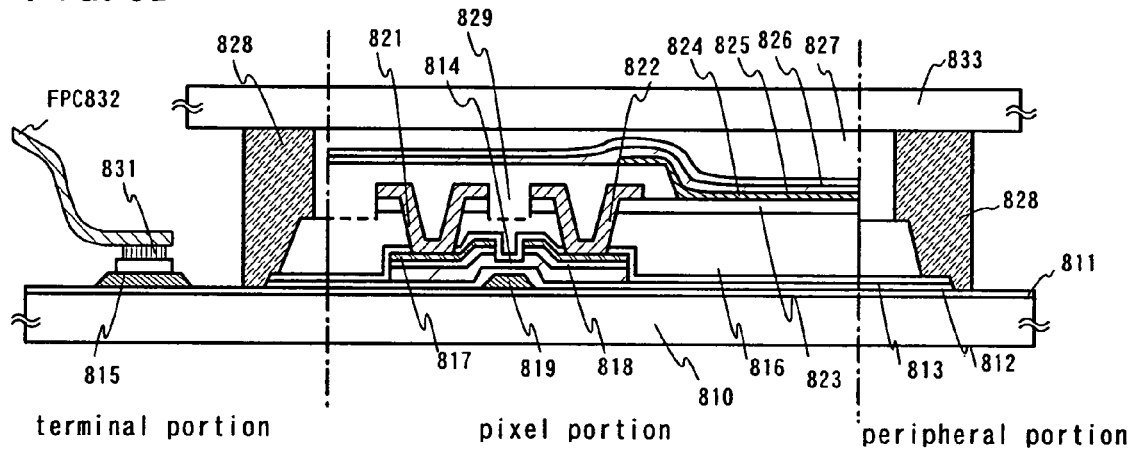

The embodiment will describe an example of an inverted-stagger type TFT with reference to FIGS. 9A and 9B. The portions other than the inverted-stagger type TFT are formed in the similar manner as FIG. 2A as described in the preferred embodiment mode, and will not be further explained.

FIG. 9A shows a channel stopper type TFT. A base insulating film 711 is formed over a substrate 710. A gate electrode 719 and a terminal electrode 715 are simultaneously formed. A semiconductor layer 714a composed of an amorphous semiconductor film, n+ layer 718, and a metal layer 717 are formed over the gate insulating film 712. A channel stopper 714b is formed on a portion where will become a channel formation region of the semiconductor layer 714a. The source and drain electrodes 721 or 722 are formed. Further a heat-resistant planarizing film 716 is formed over an insulating film 713. Further, a first electrode 723 is formed over the heat-resistant planarizing film 716. Further, a partition wall 729 is formed to cover edge portions of the first electrode 723. Further, a layer containing an organic compound 724 is formed over the first electrode 723. Further, a second electrode 725 is formed over the layer containing an organic compound 724. Further, a protective layer 726 is formed over the second electrode 725. Further, a light emitting element is sealed by attaching a sealing substrate 733 with a sealant 728. Note that a region surrounded by the sealant 728 is filled with a transparent filler 727. Further, an FPC 732 is attached to the terminal electrode 715 with an anisotropic conductive film 731 by a known method.

The depression of the heat-resistant planarizing film 716, which is formed in patterning the wirings 721 and 722, is filled with the same material as the partition wall 729.

FIG. 9A shows an n-channel TFT, wherein the first electrode 723 serves as a cathode for the light emitting element, and the second electrode 725 serves as an anode for the light emitting element.

FIG. 9B shows a channel etching TFT. A base insulating film 811 is formed over a substrate 810. A gate electrode 819 and a terminal electrode 815 are simultaneously formed. A semiconductor layer 814 composed of an amorphous semiconductor film, an n+ layer 818, and a metal layer 817 are formed on a gate insulating film 812. A portion where will become a channel formation region of the semiconductor layer 814 is thinly etched. Further, the source and drain electrodes 821 or 822 are formed. Further a heat-resistant planarizing film 816 is formed over an insulating film 813. Further, a first electrode 823 is formed over the heat-resistant planarizing film 816. Further, a partition wall 829 is formed to cover edge portions of the first electrode 823. Further, a layer containing an organic compound 824 is formed over the first electrode 823. Further, a second electrode 825 is formed over the layer containing an organic compound 824. Further, a protective layer 826 is formed over the second electrode 825. Further, a light emitting element is sealed by attaching a sealing substrate 833 with a sealant 828. Note that a region surrounded by the sealant 828 is filled with a transparent filler 827. Further, an FPC 832 is attached to the terminal electrode 815 with an anisotropic conductive film 831 by a known method.

The depression of the heat-resistant planarizing film 816 caused in patterning the wirings 821 and 822 is filled with the same material as the partition wall 829. The channel etching TFT depicted in FIG. 9B is an n-channel TFT, wherein the first electrode 823 serves as a cathode for the light emitting element, and the second electrode 825 serves as an anode for the light emitting element.

Figure 10A:
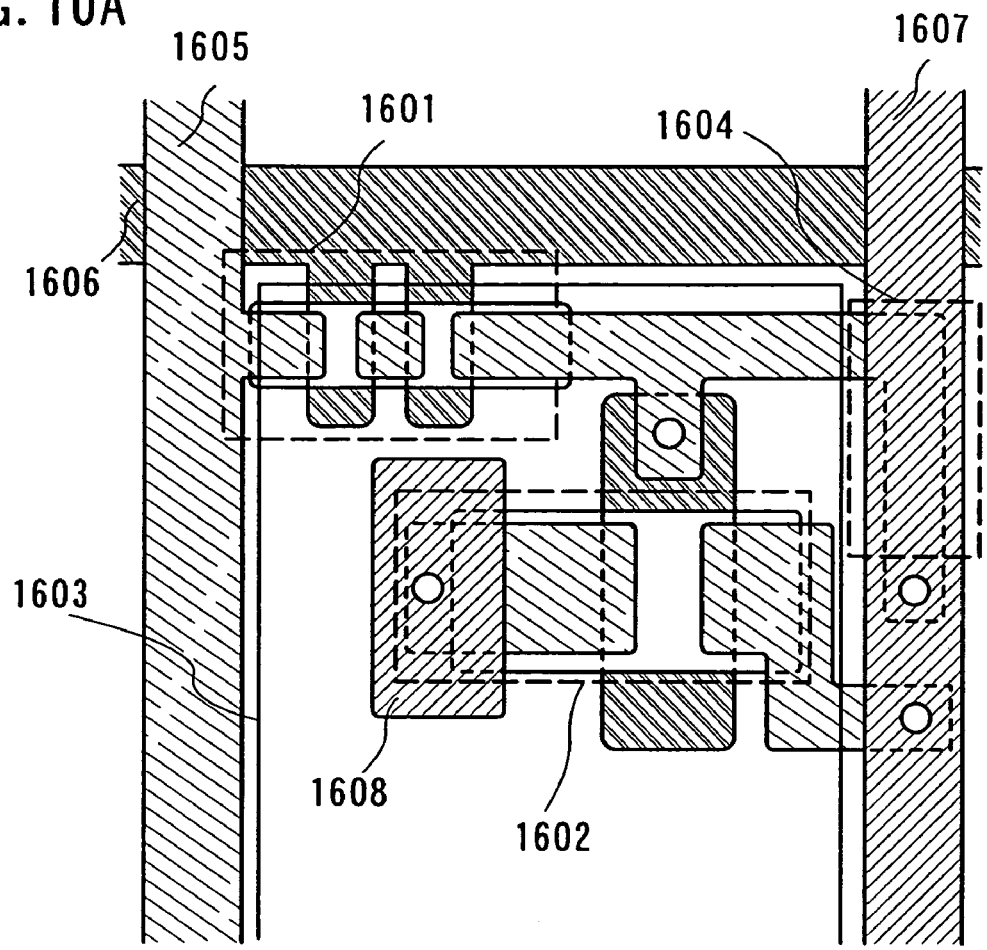
FIG. 10A is a diagram showing a pixel.
Figure 10B:
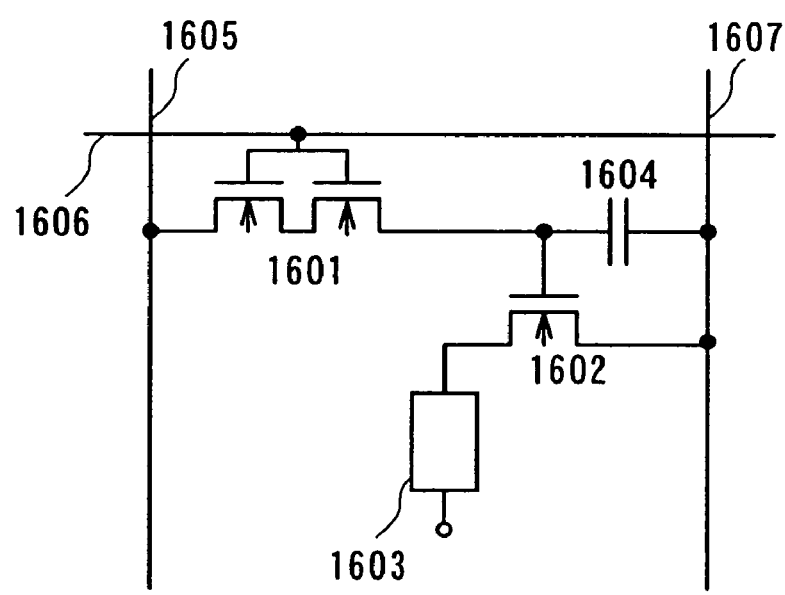
FIG. 10B is a diagram showing an equivalent circuit (Embodiment 4)

FIG. 10A is a top view showing a part of a pixel portion in which the channel etching TFT is used for a driving TFT. FIG. 10B is an equivalent circuit diagram of FIG. 10A.

In FIG. 10A, a switching TFT 1601 is an n-channel type, and has a multi-gate structure comprising two channel formation regions. Reference numeral 1602 denotes a driving TFT, which is connected to a cathode 1603 via an electrode 1608. The cathode 1603 is formed so as to cover the electrode 1608. Reference numeral 1604 denotes a storage capacitor; 1605, a source wiring; 1606, a gate wiring; and 1607, a power supply line.

Since the TFT using an amorphous semiconductor film as an active layer has low electric field-effect mobility, a driver circuit may be manufactured by attaching an IC chip etc.

As substitute for the amorphous semiconductor film, it is possible to use a semiamorphous semiconductor film (also referred to as a microcrystalline semiconductor film) including the intermediate structure; and a third condition that is stable in terms of free energy. The semiamorphous semiconductor film further comprises a crystalline region, which has short range order and lattice distortion. The TFT using the semiamorphous semiconductor film has the electric field-effect mobility of from 2 to 20 times as large as that of the TFT using the amorphous semiconductor film. When the TFT using the semiamorphous semiconductor film is employed, the driver circuit can be manufactured, besides the pixel portion.

[Embodiment 5]

Figure 11:
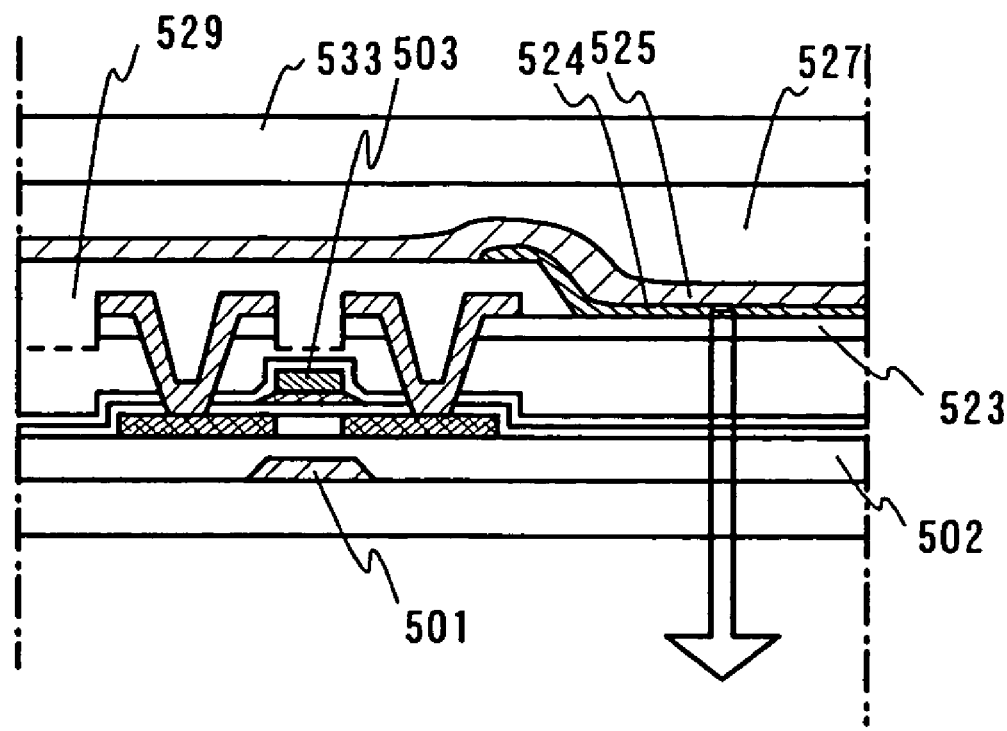
FIG. 11 is a cross sectional view of a light emitting device (Embodiment 5)

In this embodiment, an example of a light emitting device using a TFT, which includes two channels provided above and under a semiconductor film (dual channels), will be described with reference to FIG. 11. The portions other than the TFT can be formed in the similar manner as FIG. 2A as described in the preferred embodiment mode, and will not be further explained.

A first gate electrode 501 is formed on a substrate. A leveled insulating film 502 is formed so as to cover the first gate electrode 501. A semiconductor layer, a gate insulating film, a second gate electrode 503, and interlayer insulating films are sequentially formed on the leveled insulating film 502.

After forming a transparent conductive film on the interlayer insulating films, contact holes, which reach to the semiconductor layer, are formed. A source or drain electrode is formed, and the transparent conductive film is then patterned so as to form a first electrode 523. At this moment, a part of the interlayer insulating films is etched and a depression is formed therein.

A partition wall 529 for covering edges of the first electrode 523, the source electrode, and the drain electrode is formed. The material for the partition wall 529 is identical to that of the interlayer insulating films, and therefore, the depression of the interlayer insulating film is filled with the material for the partition wall. A layer 524 including an organic compound is formed on the first electrode 523 by vapor deposition or the coating method. Then, a second electrode 525 is formed.

The resultant substrate is adhered to a sealing substrate 533 with a sealant (not illustrated in the drawing). A space 527 between the sealing substrate and the second electrode is filled with a filler composed of an inert gas or a transparent resin.

According to the foregoing steps, the light emitting device utilizing the TFT, which has two channels above and under the semiconductor layer (dual channels), as the driving TFT can be completed.

A voltage is applied to both the first gate electrode 501 provided for forming a channel under the semiconductor layer and the second gate electrode 503 provided for forming another channel above the semiconductor layer. A common voltage (Vcom) or a predetermined voltage ($V_Y$) is applied to the first gate electrode 501.

As compared with the case of forming only one gate electrode, since two gate electrodes are provided in the embodiment, the fluctuation of the threshold value can be suppressed, and off current can also be reduced.

[Embodiment 6]

In the embodiment, examples of electronic appliances provided with display portions will be described with reference to FIGS. 12A to 12F. According to the invention, electronic appliances including light emitting devices of the present invention can be completed.

Further, the invention can extend the life of a light emitting device, which improves the reliability of the electronic appliances.

Such electronic appliances typically include a video camera; a digital camera; a goggle type display (head mounted display); a navigation system; an audio reproduction device (such as a car audio, and an audio component system); a personal laptop computer; a game machine; a personal digital assistance (such as a mobile computer, a cellular phone, a portable game machine, and an electronic book); an image reproduction device having a recording medium (specifically, a device having a display that can reproduce a recording medium such as a digital versatile disc (DVD) and can display the image), and the like.

Figure 12A:
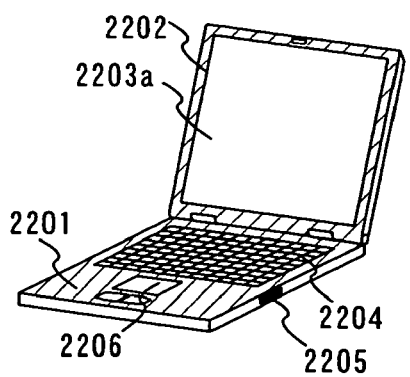
FIGS. 12A to 12F are diagrams showing examples of electronic appliances (Embodiment 6).
Figure 12B:
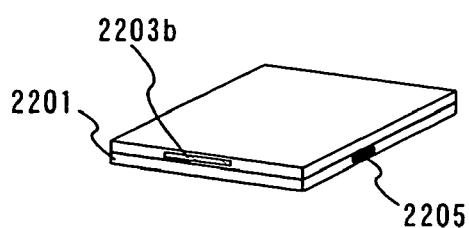

FIG. 12A is a perspective view of a personal laptop computer, which is opened. FIG. 12B shows a perspective view thereof, which is folded up. The personal laptop computer includes a main body 2201; a housing 2202; display portions 2203a and 2203b; a keyboard 2204; an external connection port 2205; a pointing mouse 2206, and the like. By applying the present invention to the display portions 2203a and 2203b, it is possible to complete a personal laptop computer having highly reliable display portions and high light-emitting efficiency (light-extraction efficiency) with high luminance, and low power consumption.

Figure 12C:
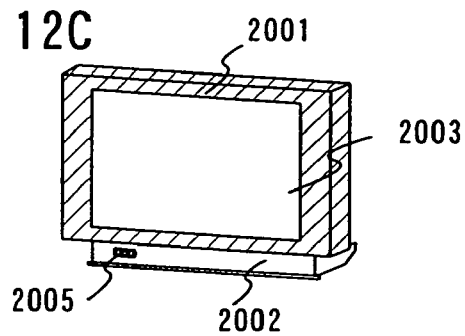

FIG. 12C is a television, including a housing 2001; a supporting base 2002; a display portion 2003; a video input terminal 2005, and the like. The television includes every television for displaying information such as one for a personal computer, for receiving TV broadcasting, and for advertisement. By applying the present invention to the display portion 2003, it is possible to complete a television having a highly reliable display portion and high light-emitting efficiency (light-extraction efficiency) with high luminance, and low power consumption.

Figure 12D:
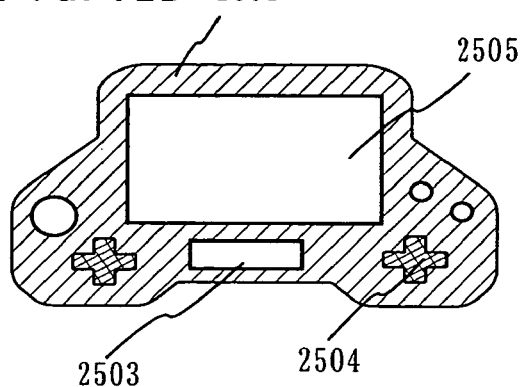

FIG. 12D is a portable gate machine, including a main body 2501; a display portions 2503 and 2505; operation switches 2504, and the like. By applying the present invention to the display portions 2503 and 2505, it is possible to complete a portable game machine having a highly reliable display portion and high light-emitting efficiency (light-extraction efficiency) with high luminance, and low power consumption.

Figure 12E:
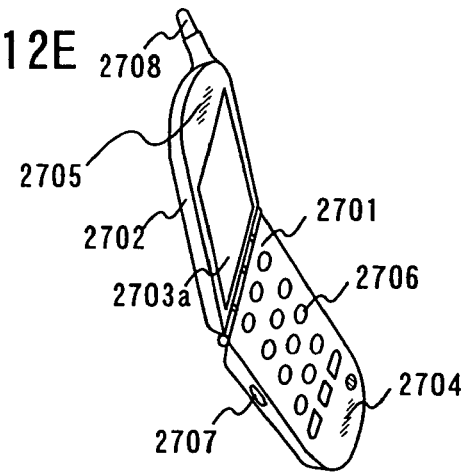
Figure 12F:
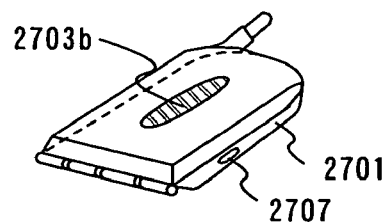

FIG. 12E is a perspective view of a cellular phone, which is opened. FIG. 12F is a perceptive view thereof, which is folded up. The cellular phone includes a main body 2701; a housing 2702; display portions 2703a and 2703b; an audio input portion 2704; an audio output portion 2705; operation keys 2706; an external connection port 2707; an antenna 2708, and the like.

The cellular phone as depicted in FIGS. 12E and 12F include the display portions 2703a that mainly displays high-definition full color image and the display portions 2703b that mainly displays characters and symbols by an area color mode. By applying the present invention to the display portions 2703a and 2703b, it is possible to complete a cellular phone having highly reliable display portions and high light-emitting efficiency (light-extraction efficiency) with high luminance, and low power consumption.

As set forth above, the light emitting device manufactured according to the invention can be applied to display portions for any electronic appliances. The electronic appliances of the embodiment can utilize any light emitting devices manufactured according to the embodiment mode, and Embodiment 1 through Embodiment 5.

Since the interlayer insulating films and the partition wall are formed of the same material, the manufacturing cost can be reduced. The devices such as a film formation device, and an etching device are shared, and hence, the manufacturing cost can be reduced.

Note that, these embodiments show the case of using a light emitting device, however, this invention may be applied to other display device such as a liquid crystal display device.

What is claimed is:

1. A method of manufacturing a light emitting device comprising the steps of:
   forming a thin film transistor having a semiconductor layer including a source region, a drain region, and a channel formation region between the source region and the drain region, a gate insulating film, and a gate electrode over a substrate;
   forming a heat-resistant planarizing film over the thin film transistor;
   forming a transparent conductive film over the heat-resistant planarizing film;
   forming an opening over the source region or the drain region and a peripheral portion having a tapered shape by selectively removing the heat-resistant planarizing film together with the transparent conductive film, wherein the opening has a tapered side surface;
   forming a contact hole reaching the source region or the drain region by selectively removing the gate insulating film;
   forming a conductive film on the transparent conductive film;
   etching the conductive film using the transparent conductive film as an etching stopper so as to form an electrode reaching the source region or the drain region;
   forming an anode by patterning the transparent conductive film in contact with the electrode;
   forming a partition wall covering edges of the anode;
   forming a layer including an organic compound on the anode; and
   forming a cathode on the layer including the organic compound.

2. The method of manufacturing the light emitting device according to claim 1, wherein the heat-resistant planarizing film is a SiOx film containing an alkyl group formed by a coating method.

3. The method of manufacturing the light emitting device according to claim 1, wherein the partition wall is a SiOx film containing an alkyl group formed by a coating method.

4. The method of manufacturing the light emitting device according to claim 1, wherein the anode is formed by sputtering using a target formed of indium tin oxide containing SiOx.

5. The method of manufacturing the light emitting device according to claim 1, wherein the transparent conductive film is removed in the peripheral portion at the same time as patterning the transparent conductive film.

6. A method of manufacturing a light emitting device comprising the steps of:
   forming a thin film transistor having a semiconductor layer including a source region, a drain region, and a channel formation region between the source region and the drain region, a gate insulating film, and a gate electrode over a substrate;
   forming an insulating film over the thin film transistor;
   forming a transparent conductive film over the insulating film;
   forming an opening over the source region or the drain region by selectively removing the insulating film together with the transparent conductive film;
   forming a contact hole reaching the source region or the drain region by selectively removing the gate insulating film;
   forming a conductive film on the transparent conductive film;
   etching the conductive film using the transparent conductive film as an etching stopper so as to form an electrode reaching the source region or the drain region;
   forming an anode by patterning the transparent conductive film in contact with the electrode;
   forming a partition wall covering edges of the anode;
   forming a layer including an organic compound on the anode; and
   forming a cathode on the layer including the organic compound.

7. The method of manufacturing the light emitting device according to claim 6, wherein the insulating film is a SiOx film containing an alkyl group formed by a coating method.

8. The method of manufacturing the light emitting device according to claim 6, wherein the partition wall is a SiOx film containing an alkyl group formed by a coating method.

9. The method of manufacturing the light emitting device according to claim 6, wherein the anode is formed by sputtering using a target formed of indium tin oxide containing SiOx.

10. The method of manufacturing the light emitting device according to claim 6, wherein the opening has a tapered side surface.

11. The method of manufacturing the light emitting device according to claim 6, wherein the insulating film is a heat-resistant planarizing.

12. The method of manufacturing the light emitting device according to claim 6, wherein the transparent conductive film is removed in the peripheral portion at the same time as patterning the transparent conductive film.

13. A method of manufacturing a display device comprising the steps of:
  forming a thin film transistor having a semiconductor layer including a source region, a drain region, and a channel formation region between the source region and the drain region, a gate insulating film, and a gate electrode over a substrate;
  forming an insulating film over the thin film transistor;
  forming a transparent conductive film over the insulating film;
  forming an opening over the source region or the drain region by selectively removing the insulating film together with the transparent conductive film;
  forming a contact hole reaching the source region or the drain region by selectively removing the gate insulating film;
  forming a conductive film on the transparent conductive film;
  etching the conductive film using the transparent conductive film as an etching stopper so as to form an electrode reaching the source region or the drain region; and
  forming a pixel electrode by patterning the transparent conductive film in contact with the electrode.

14. The method of manufacturing the display device according to claim 13, wherein the insulating film is a SiOx film containing an alkyl group formed by a coating method.

15. The method of manufacturing the display device according to claim 13, wherein the opening has a tapered side surface.

16. The method of manufacturing the display device according to claim 13, wherein the insulating film is a heat-resistant planarizing.

17. The method of manufacturing the display device according to claim 13, wherein the transparent conductive film is removed in the peripheral portion at the same time as patterning the transparent conductive film.

18. A method of manufacturing a light emitting device comprising the steps of:
  forming a thin film transistor having a semiconductor layer including a source region, a drain region, and a channel formation region between the source region and the drain region, a gate insulating film, and a gate electrode over a substrate;
  forming a heat-resistant planarizing film over the thin film transistor;
  forming a transparent conductive film over the heat-resistant planarizing film;
  forming an opening over the source region or the drain region and a peripheral portion having a tapered shape by selectively removing the heat-resistant planarizing film and the transparent conductive film, wherein the opening has a tapered side surface;
  forming a contact hole reaching the source region or the drain region by selectively removing the gate insulating film;
  forming a conductive film on the transparent conductive film;
  etching the conductive film using the transparent conductive film as an etching stopper so as to form an electrode reaching the source region or the drain region;
  forming an anode by patterning the transparent conductive film in contact with the electrode after etching the conductive film;
  forming a partition wall covering edges of the anode;
  forming a layer including an organic compound on the anode; and
  forming a cathode on the layer including the organic compound.

19. The method of manufacturing the light emitting device according to claim 18, wherein the heat-resistant planarizing film is a SiOx film containing an alkyl group formed by a coating method.

20. The method of manufacturing the light emitting device according to claim 18, wherein the partition wall is a SiOx film containing an alkyl group formed by a coating method.

21. The method of manufacturing the light emitting device according to claim 18, wherein the anode is formed by sputtering using a target formed of indium tin oxide containing SiOx.

22. The method of manufacturing the light emitting device according to claim 18, wherein the transparent conductive film is removed in the peripheral portion at the same time as patterning the transparent conductive film.

23. A method of manufacturing a light emitting device comprising the steps of:
  forming a thin film transistor having a semiconductor layer including a source region, a drain region, and a channel formation region between the source region and the drain region, a gate insulating film, and a gate electrode over a substrate;
  forming an insulating film over the thin film transistor;
  forming a transparent conductive film over the insulating film;
  forming an opening over the source region or the drain region by selectively removing the insulating film and the transparent conductive film;
  forming a contact hole reaching the source region or the drain region by selectively removing the gate insulating film;
  forming a conductive film on the transparent conductive film;
  etching the conductive film using the transparent conductive film as an etching stopper so as to form an electrode reaching the source region or the drain region;
  forming an anode by patterning the transparent conductive film in contact with the electrode after etching the conductive film;
  forming a partition wall covering edges of the anode;
  forming a layer including an organic compound on the anode; and
  forming a cathode on the layer including the organic compound.

24. The method of manufacturing the light emitting device according to claim 23, wherein the insulating film is a SiOx film containing an alkyl group formed by a coating method.

25. The method of manufacturing the light emitting device according to claim 23, wherein the partition wall is a SiOx film containing an alkyl group formed by a coating method.

26. The method of manufacturing the light emitting device according to claim 23, wherein the anode is formed by sputtering using a target formed of indium tin oxide containing SiOx.

27. The method of manufacturing the light emitting device according to claim 23, wherein the opening has a tapered side surface.

28. The method of manufacturing the light emitting device according to claim 23, wherein the insulating film is a heat-resistant planarizing.

29. The method of manufacturing the light emitting device according to claim 23, wherein the transparent conductive film is removed in the peripheral portion at the same time as patterning the transparent conductive film.

30. A method of manufacturing a display device comprising the steps of:
   forming a thin film transistor having a semiconductor layer including a source region, a drain region, and a channel formation region between the source region and the drain region, a gate insulating film, and a gate electrode over a substrate;
   forming an insulating film over the thin film transistor;
   forming a transparent conductive film over the insulating film;
   forming an opening over the source region or the drain region by selectively removing the insulating film and the transparent conductive film;
   forming a contact hole reaching the source region or the drain region by selectively removing the gate insulating film;
   forming a conductive film on the transparent conductive film;
   etching the conductive film using the transparent conductive film as an etching stopper so as to form an electrode reaching the source region or the drain region; and
   forming a pixel electrode by patterning the transparent conductive film in contact with the electrode after etching the conductive film.

31. The method of manufacturing the display device according to claim 30, wherein the insulating film is a SiOx film containing an alkyl group formed by a coating method.

32. The method of manufacturing the display device according to claim 30, wherein the opening has a tapered side surface.

33. The method of manufacturing the display device according to claim 30, wherein the insulating film is a heat-resistant planarizing.

34. The method of manufacturing the display device according to claim 30, wherein the transparent conductive film is removed in the peripheral portion at the same time as patterning the transparent conductive film.

* * * * *